US012706142B2

(12) United States Patent
Tortorelli et al.

(10) Patent No.: US 12,706,142 B2
(45) Date of Patent: Aug. 11, 2026

(54) TECHNIQUES FOR MULTI-LEVEL CHALCOGENIDE MEMORY CELL PROGRAMMING

(71) Applicant: Micron Technology, Inc., Boise, ID (US)

(72) Inventors: Innocenzo Tortorelli, Cernusco sul Naviglio (IT); Alessandro Sebastiani, Piacenza (IT); Mattia Robustelli, Milan (IT); Matteo Impalà, Milan (IT)

(73) Assignee: Micron Technology, Inc., Boise, ID (US)

( * ) Notice: Subject to any disclaimer, the term of this patent is extended or adjusted under 35 U.S.C. 154(b) by 65 days.

(21) Appl. No.: 18/742,753

(22) Filed: Jun. 13, 2024

(65) Prior Publication Data

US 2024/0404590 A1 Dec. 5, 2024

Related U.S. Application Data

(63) Continuation of application No. 17/740,062, filed on May 9, 2022, now Pat. No. 12,033,695.

(51) Int. Cl.
*G11C 11/56* (2006.01)
*G11C 13/00* (2006.01)

(52) U.S. Cl.
CPC ...... *G11C 11/5678* (2013.01); *G11C 13/0004* (2013.01); *G11C 13/0069* (2013.01); *G11C 13/0097* (2013.01); *G11C 2013/0073* (2013.01); *G11C 2013/0078* (2013.01); *G11C 2013/0092* (2013.01)

(58) Field of Classification Search
CPC ............ G11C 11/5678; G11C 13/0004; G11C 13/0069; G11C 13/0097; G11C 2013/0073; G11C 2013/0078; G11C 2013/0092; G11C 13/004; G11C 7/1078; G11C 7/1051; G11C 7/1096; G11C 7/18; G11C 8/14
See application file for complete search history.

(56) References Cited

U.S. PATENT DOCUMENTS

| | | | |
|---|---|---|---|
| 10,381,075 | B2 | 8/2019 | Totorelli et al. |
| 10,546,632 | B2 | 1/2020 | Redaelli et al. |
| 10,803,939 | B2 | 10/2020 | Castro et al. |
| 11,177,009 | B2 | 11/2021 | Hirst et al. |
| 11,295,822 | B2 | 4/2022 | Sarpatwari et al. |
| 11,315,633 | B2 | 4/2022 | Castro et al. |
| 11,984,191 | B2 | 5/2024 | Castro et al. |

(Continued)

*Primary Examiner* — Donald HB Braswell
(74) *Attorney, Agent, or Firm* — Holland & Hart LLP

(57) ABSTRACT

Methods, systems, and devices for improved techniques for multi-level memory cell programming are described. A memory array may receive a first command to store a first logic state in a memory cell for storing three or more logic states. The memory array may apply, as part of an erase operation, a first pulse with a first polarity to a plurality of memory cells to store a second logic state different from the first logic state in the plurality of memory cells, where the plurality of memory cells includes the memory cell. The memory array may apply, as part of a write operation or as part of the erase operation, one or more second pulses with a second polarity to the memory cell to store the first logic state in the memory cell based on applying the first pulse.

18 Claims, 11 Drawing Sheets

(56) References Cited

U.S. PATENT DOCUMENTS

| | | | | |
|---|---|---|---|---|
| 2003/0026134 | A1* | 2/2003 | Lowrey | G11C 13/004 365/185.15 |
| 2003/0027134 | A1 | 2/2003 | Egashira et al. | |
| 2015/0129829 | A1* | 5/2015 | Kumar | G11C 13/003 257/5 |
| 2018/0122472 | A1* | 5/2018 | Pirovano | G11C 13/0069 |
| 2019/0378568 | A1* | 12/2019 | Robustelli | G11C 13/0069 |
| 2020/0365221 | A1 | 11/2020 | Yang et al. | |
| 2021/0005250 | A1 | 1/2021 | Tortorelli | |
| 2022/0238171 | A1* | 7/2022 | Chung | G11C 13/003 |
| 2023/0154541 | A1* | 5/2023 | Yuan | G11C 11/5628 365/185.29 |

* cited by examiner

400

450

Figure 11:
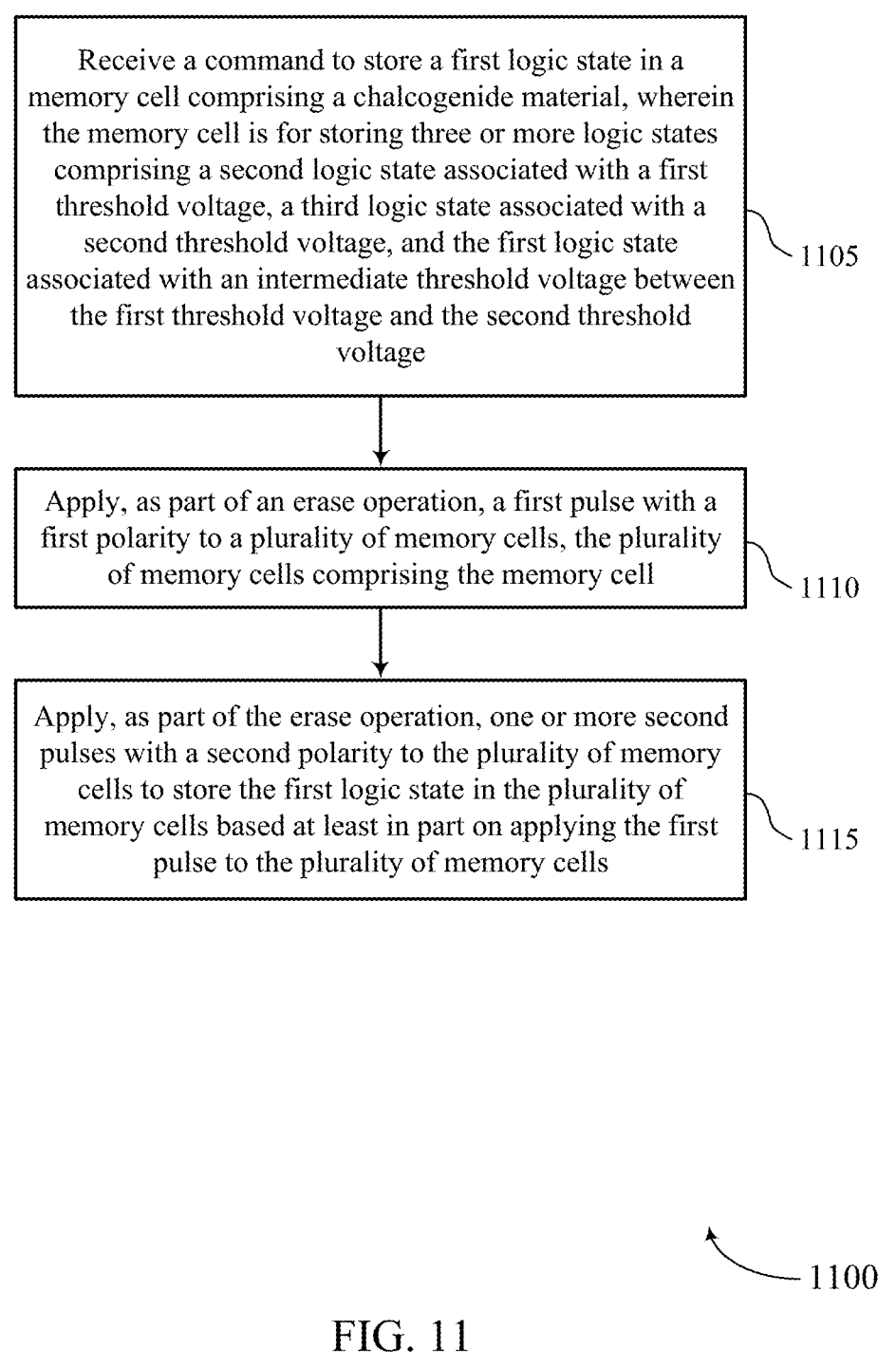

Receive a command to store a first logic state in a memory cell comprising a chalcogenide material, wherein the memory cell is for storing three or more logic states comprising a second logic state associated with a first threshold voltage, a third logic state associated with a second threshold voltage, and the first logic state associated with an intermediate threshold voltage between the first threshold voltage and the second threshold voltage

1105

Apply, as part of an erase operation, a first pulse with a first polarity to a plurality of memory cells, the plurality of memory cells comprising the memory cell

1110

Apply, as part of the erase operation, one or more second pulses with a second polarity to the plurality of memory cells to store the first logic state in the plurality of memory cells based at least in part on applying the first pulse to the plurality of memory cells

TECHNIQUES FOR MULTI-LEVEL CHALCOGENIDE MEMORY CELL PROGRAMMING

CROSS REFERENCE

The present Application for Patent is a continuation of U.S. patent application Ser. No. 17/740,062, by Tortorelli et al., entitled "IMPROVED TECHNIQUES FOR MULTI-LEVEL MEMORY CELL PROGRAMMING," filed May 9, 2022, which is assigned to the assignee hereof and is expressly incorporated by reference herein.

FIELD OF TECHNOLOGY

The following relates to one or more systems for memory, including improved techniques for multi-level memory cell programming.

BACKGROUND

Memory devices are widely used to store information in various electronic devices such as computers, user devices, wireless communication devices, cameras, digital displays, and the like. Information is stored by programming memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read (e.g., sense, detect, retrieve, identify, determine, evaluate) a stored state in the memory device. To store information, a component may write (e.g., program, set, assign) the state in the memory device.

Various types of memory devices and memory cells exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be described in terms of volatile configurations or non-volatile configurations. Memory cells configured in a non-volatile configuration may maintain stored logic states for extended periods of time even in the absence of an external power source. Memory cells configured in a volatile configuration may lose stored states when disconnected from an external power source.

BRIEF DESCRIPTION OF THE DRAWINGS

FIGS. 10 and 11 show flowcharts illustrating a method or methods that support improved techniques for multi-level memory cell programming in accordance with examples as disclosed herein.

DETAILED DESCRIPTION

Figure 1:
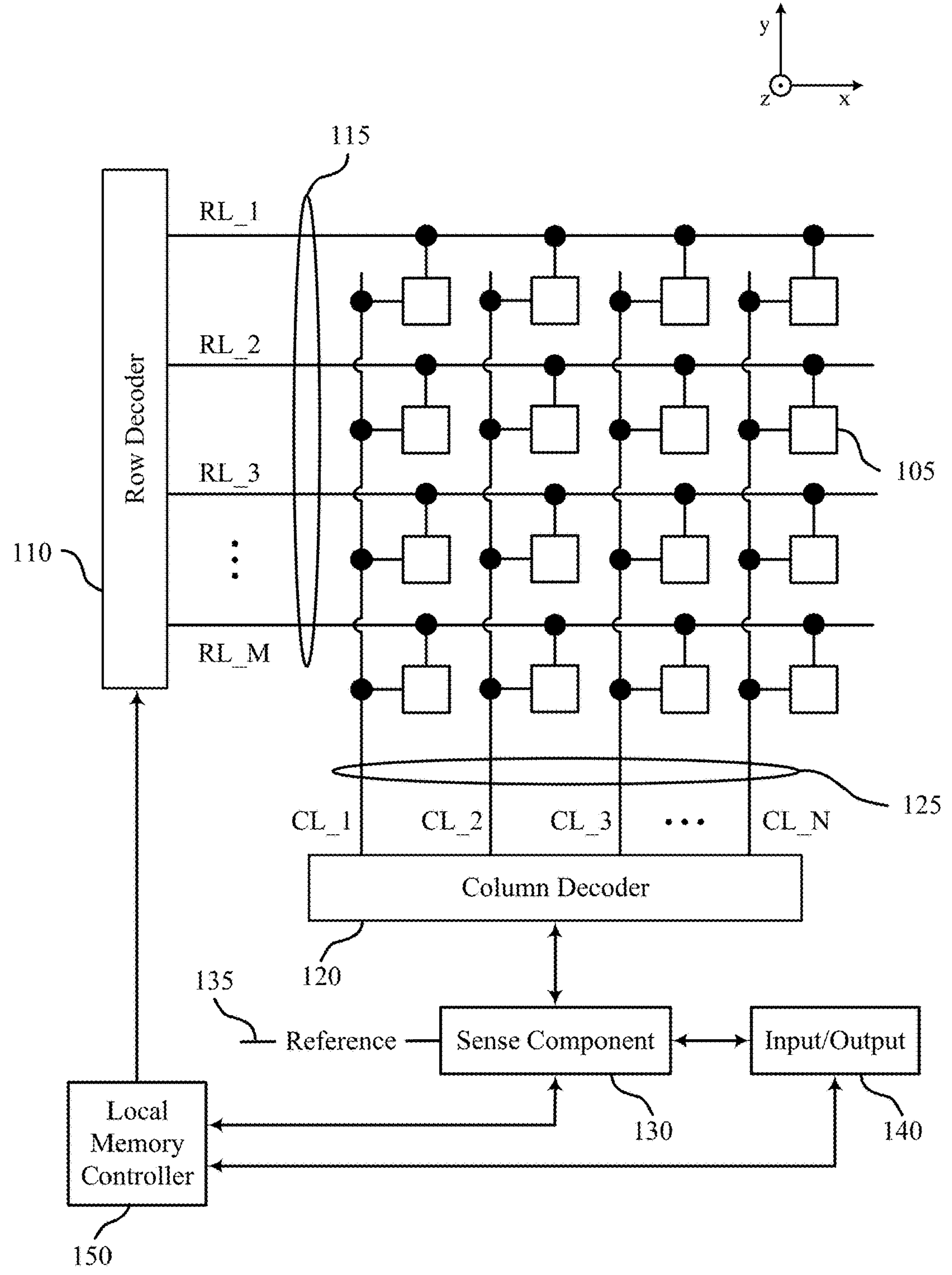
FIG. 1 illustrates an example of a memory array that supports improved techniques for multi-level memory cell programming in accordance with examples as disclosed herein.

Some memory cells may be capable of storing three or more logic states. For example, a memory cell may include a configurable storage element, such as a chalcogenide storage element, which may be programmed to store three or more logic states by applying one or more pulses to the memory cell. Applying a pulse (e.g., a programming pulse) to the memory cell may include applying a voltage with a positive or a negative polarity to the memory cell. The voltage may be applied to the memory cell by routing one or more currents through one or more access lines coupled with the memory cell. In some cases, each logic state of the three or more logic states may correspond to one or more properties (e.g., one or more physical states) of the configurable storage element (e.g., a voltage threshold associated with the configurable storage element, a phase of the configurable storage element, a resistance of the configurable storage element), which may be altered by applying the one or more pulses to the memory cell.

A first logic state (e.g., a RESET state) may be stored in the memory cell by applying a pulse with a first polarity (e.g., a positive polarity) to the memory cell, a second logic state (e.g., a SET state) may be stored in the memory cell by applying a pulse with a second polarity (e.g., a negative polarity) to the memory cell, and a third logic state (e.g., an intermediate state) may be stored in the memory cell by applying two pulses to the memory cell (e.g., sequentially) with different polarities. For example, to store the third logic state in the memory cell, a first pulse with the first polarity may be applied to the memory cell to program the first logic state and a second pulse with the second polarity may be applied to the memory cell to program the third logic state. Programming the third logic state may include a polarity flip while programming the first and second logic state may not include a polarity flip. Additionally, the polarity for the programming pulse to store the third logic state (e.g., an intermediate state) may be the same polarity of the programming pulse for storing one of the first logic state or the second logic state. As such, one or more characteristics of the programming pulse to store the third logic state (e.g., an intermediate state) may be different than the other programming pulse having the same polarity to place a state of the memory cell in the third logic state. Accordingly, programming the third logic state may consume additional power and processing resources when compared to programming the first or second logic state.

In some cases, a memory device may perform a read operation to read a logic state stored in a memory cell. The read operation may include applying one or more read pulses to the memory cell and monitoring for a snapback event (e.g., a voltage spike associated with applying the one or more read pulses to the storage element). A memory controller may determine a logic state stored in the memory cell based on whether the snapback event occurs. In some cases, the occurrence of the snapback event may be based on a voltage of a read pulse. For example, each logic state of the three or more logic states may be associated with a distribution of threshold voltages.

In some cases, a snapback event may occur based on a value of a read voltage relative to a voltage threshold of the memory cell. However, a threshold voltage associated with a respective logic state may drift (e.g., over a duration of time), which may reduce an accuracy of read operations. Additionally or alternatively, drift associated with one or more threshold voltages may reduce an accuracy associated with some write operations (e.g., sequential write operations) where an initial logic state stored in a memory cell may be unknown or associated with a drifted threshold voltage. In some cases, to improve accuracy associated with write operations (e.g., sequential write operations) one or more operations for determining a previous logic state stored in a memory cell may be performed (e.g., a pre-read operation). However, the one or more operations for determining the previous logic state may consume power and processing resources, which may be undesirable for memory device performance.

In accordance with aspects of the present disclosure a memory device may perform a write operation in conjunction with an asynchronous access operation. The asynchronous access operation may store a known logic state in the memory cell prior to the write operation. For example, the asynchronous access operation may be an asynchronous erase operation, which may store the RESET state in the memory cell. Storing the known logic state in the memory cell as part of the asynchronous access operation may enable the memory device to perform different write operations using one or more pulses with a same polarity (e.g., the memory device may avoid a polarity flip as part of the write operation). For example, storing the known logic state in the memory cell may enable the memory device to write a SET state to the memory cell using a first set of characteristics of a programming pulse having the second polarity and to write an intermediate state to the memory cell using a second set of characteristics of a programming pulse having the second polarity (e.g., the same polarity as the programming pulse used for the set state).

In some cases, the asynchronous access operation may store the first logic state (e.g., the RESET state) or the third logic state (e.g., the intermediate logic state) in the memory cell, which may reduce a threshold voltage drift. The asynchronous access operation may be a default, periodic operation (e.g., a block erase operation), which may not consume additional power or processing overhead. As part of the write operation, the memory device or the memory controller may configure the one or more programming pulses based on a desired logic state. For example, the memory device or the memory controller may select a current of the one or more programming pulses, a voltage of the one or more programming pulses, a duration of the one or more programming pulses, a quantity of the one or more programming pulses, or any combination thereof based on a logic state to be stored in the memory cell. For example, a programming pulse with a relatively short duration may correspond to storing the third logic state (e.g., the intermediate state) in the memory cell. A programming pulse with a relatively long duration may correspond to storing the second logic state (e.g., the set state) in the memory cell. Additionally or alternatively, the memory device may refrain from applying a pulse to store the first logic state (e.g., the RESET state) in the memory cell if the first logic state has been previously stored in the memory cell by the asynchronous access operation.

Features of the disclosure are initially described in the context of memory systems, dies, and arrays as described with reference to FIGS. 1-3B. Features of the disclosure are described in the context of timing diagrams and voltage distribution diagrams as described with reference to FIGS. 4A-8. These and other features of the disclosure are further illustrated by and described with reference to an apparatus diagram and flowcharts that relate to improved techniques for multi-level memory cell programming as described with references to FIGS. 9-11.

FIG. 1 illustrates an example of a memory device 100 that supports improved techniques for multi-level memory cell programming in accordance with examples as disclosed herein. In some examples, the memory device 100 may be referred to as or include a memory die, a memory chip, or an electronic memory apparatus. The memory device 100 may be operable to provide locations to store information (e.g., physical memory addresses) that may be used by a system (e.g., a host device coupled with the memory device 100, for writing information, for reading information).

The memory device 100 may include one or more memory cells 105 that each may be programmable to store different logic states (e.g., a programmed one of a set of two or more possible states). For example, a memory cell 105 may be operable to store one bit of information at a time (e.g., a logic 0 or a logic 1). In some examples, a memory cell 105 (e.g., a multi-level memory cell 105) may be operable to store more than one bit of information at a time (e.g., a logic 00, logic 01, logic 10, a logic 11). In some examples, the memory cells 105 may be arranged in an array.

A memory cell 105 may store a logic state using a configurable material, which may be referred to as a memory element, a storage element, a memory storage element, a material element, a material memory element, a material portion, or a polarity-written material portion, among others. A configurable material of a memory cell 105 may refer to a chalcogenide-based storage component. For example, a chalcogenide storage element may be used in a phase change memory cell, a thresholding memory cell, or a self-selecting memory cell, among other architectures.

In some examples, the material of a memory cell 105 may include a chalcogenide material or other alloy including selenium (Se), tellurium (Te), arsenic (As), antimony (Sb), carbon (C), germanium (Ge), silicon (Si), or indium (IN), or various combinations thereof. In some examples, a chalcogenide material having primarily selenium (Se), arsenic (As), and germanium (Ge) may be referred to as a SAG-alloy. In some examples, a SAG-alloy may also include silicon (Si) and such chalcogenide material may be referred to as SiSAG-alloy. In some examples, SAG-alloy may include silicon (Si) or indium (In) or a combination thereof and such chalcogenide materials may be referred to as SiSAG-alloy or InSAG-alloy, respectively, or a combination thereof. In some examples, the chalcogenide material may include additional elements such as hydrogen (H), oxygen (O), nitrogen (N), chlorine (Cl), or fluorine (F), each in atomic or molecular forms.

In some examples, a memory cell 105 may be an example of a phase change memory cell. In such examples, the material used in the memory cell 105 may be based on an alloy (such as the alloys listed above) and may be operated so as to change to different physical state (e.g., undergo a phase change) during normal operation of the memory cell 105. For example, a phase change memory cell 105 may be associated with a relatively disordered atomic configuration (e.g., a relatively amorphous state) and a relatively ordered atomic configuration (e.g., a relatively crystalline state). A relatively disordered atomic configuration may correspond to a first logic state (e.g., a RESET state, a logic 0) and a relatively ordered atomic configuration may correspond to a second logic state (e.g., a logic state different than the first logic state, a SET state, a logic 1).

In some examples (e.g., for thresholding memory cells 105, for self-selecting memory cells 105), some or all of the set of logic states supported by the memory cells 105 may be associated with a relatively disordered atomic configuration of a chalcogenide material (e.g., the material in an amorphous state may be operable to store different logic states). In some examples, the storage element of a memory cell 105 may be an example of a self-selecting storage element. In such examples, the material used in the memory cell 105 may be based on an alloy (e.g., such as the alloys listed above) and may be operated so as to undergo a change to a different physical state during normal operation of the memory cell 105. For example, a self-selecting or thresholding memory cell 105 may have a high threshold voltage state and a low threshold voltage state. A high threshold voltage state may correspond to a first logic state (e.g., a RESET state, a logic 0) and a low threshold voltage state may correspond to a second logic state (e.g., a logic state different than the first logic state, a SET state, a logic 1).

During a write operation (e.g., a programming operation) of a self-selecting or thresholding memory cell 105, a polarity used for a write operation may influence (e.g., determine, set, program) a behavior or characteristic of the material of the memory cell 105, such as a thresholding characteristic (e.g., a threshold voltage) of the material. A difference between thresholding characteristics of the material of the memory cell 105 for different logic states stored by the material of the memory cell 105 (e.g., a difference between threshold voltages when the material is storing a logic state '0' versus a logic state '1') may correspond to the read window of the memory cell 105.

In some cases, a property or characteristic of the material of the memory cell 105, such as a threshold voltage of the material, may drift over time. For example, a property associated with the material of the memory cell 105 may change over time if the memory cell 105 is not reprogrammed. In some cases, threshold voltage drift may reduce a read window of the memory cell 105 or may otherwise create challenges associated with effectively reading logic states stored in the memory cell 105. For example, a read pulse for reading a logic state from the memory cell 105 may be based on a threshold voltage distribution. That is, the memory device 100 or the local memory controller 150 may select one or more parameters for a read pulse (e.g., a voltage of the read pulse) based on the threshold voltage. Additionally or alternatively, a snapback event may occur based on a voltage of the read pulse relative to threshold voltage. Accordingly, if a threshold voltage has drifted, the memory device 100 may not be able to accurately read the stored logic state from the memory cell.

In accordance with aspects of the present disclosure, the memory device 100 may perform a write operation in conjunction with an asynchronous access operation, which may reduce a threshold voltage drift and increase a final read window budget. The asynchronous access operation may store a known logic state in the memory cell prior to the write operation. Accordingly, the memory device 100 may effectively perform the write operation using one or more programming pulses with a same polarity (e.g., the memory device 100 may avoid a polarity flip as part of the write operation), which may conserve power and processing resources at the memory device 100.

The memory device 100 may configure one or more parameters for the one or more programming pulses based on a logic state to be programmed. For example, the memory device 100 or local memory controller 150 may apply a relatively short programming pulse to a memory cell 105, which may change a physical state of the material of the memory cell 105. The physical state of the material of the memory cell 105 may be associated with an intermediate logic state and may correspond to a respective threshold voltage distribution. Similarly, the memory device 100 or local memory controller 150 may apply additional programming pulses with one or more configured parameters (e.g., pulse voltage, pulse current, pulse duration, pulse quantity) corresponding to other logic states and threshold voltages.

The memory device 100 may include access lines (e.g., row lines 115 each extending along an illustrative x-direction, column lines 125 each extending along an illustrative y-direction) arranged in a pattern, such as a grid-like pattern. Access lines may be formed with one or more conductive materials. In some examples, row lines 115, or some portion thereof, may be referred to as word lines. In some examples, column lines 125, or some portion thereof, may be referred to as digit lines or bit lines. References to access lines, or their analogues, are interchangeable without loss of understanding. Memory cells 105 may be positioned at intersections of access lines, such as row lines 115 and the column lines 125. In some examples, memory cells 105 may also be arranged (e.g., addressed) along an illustrative z-direction, such as in an implementation of sets of memory cells 105 being located at different levels (e.g., layers, decks, planes, tiers) along the illustrative z-direction. In some examples, a memory device 100 that includes memory cells 105 at different levels may be supported by a different configuration of access lines, decoders, and other supporting circuitry than shown.

Operations such as read operations and write operations may be performed on the memory cells 105 by activating access lines such as one or more of a row line 115 or a column line 125, among other access lines associated with alternative configurations. For example, by activating a row line 115 and a column line 125 (e.g., applying a voltage to the row line 115 or the column line 125), a memory cell 105 may be accessed in accordance with their intersection. An intersection of a row line 115 and a column line 125, among other access lines, in various two-dimensional or three-dimensional configuration may be referred to as an address of a memory cell 105. In some examples, an access line may be a conductive line coupled with a memory cell 105 and may be used to perform access operations on the memory cell 105. In some examples, the memory device 100 may perform operations responsive to commands, which may be issued by a host device coupled with the memory device 100 or may be generated by the memory device 100 (e.g., by a local memory controller 150).

Accessing the memory cells 105 may be controlled through one or more decoders, such as a row decoder 110 or a column decoder 120, among other examples. For example, a row decoder 110 may receive a row address from the local memory controller 150 and activate a row line 115 based on the received row address. A column decoder 120 may receive a column address from the local memory controller 150 and may activate a column line 125 based on the received column address.

The sense component 130 may be operable to detect a state (e.g., a material state, a resistance state, a threshold state) of a memory cell 105 and determine a logic state of the memory cell 105 based on the detected state. The sense component 130 may include one or more sense amplifiers to convert (e.g., amplify) a signal resulting from accessing the memory cell 105 (e.g., a signal of a column line 125 or other access line). The sense component 130 may compare a signal detected from the memory cell 105 to a reference 135 (e.g., a reference voltage, a reference charge, a reference current). The detected logic state of the memory cell 105 may be provided as an output of the sense component 130 (e.g., to an input/output component 140), and may indicate the detected logic state to another component of the memory device 100 or to a host device coupled with the memory device 100.

The local memory controller 150 may control the accessing of memory cells 105 through the various components (e.g., a row decoder 110, a column decoder 120, a sense component 130, among other components). In some examples, one or more of a row decoder 110, a column decoder 120, and a sense component 130 may be co-located with the local memory controller 150. The local memory controller 150 may be operable to receive information (e.g., commands, data) from one or more different controllers (e.g., an external memory controller associated with a host device, another controller associated with the memory device 100), translate the information into a signaling that can be used by the memory device 100, perform one or more operations on the memory cells 105 and communicate data from the memory device 100 to a host device based on performing the one or more operations. The local memory controller 150 may generate row address signals and column address signals to activate access lines such as a target row line 115 and a target column line 125. The local memory controller 150 also may generate and control various signals (e.g., voltages, currents) used during the operation of the memory device 100. In general, the amplitude, the shape, or the duration of an applied signal discussed herein may be varied and may be different for the various operations discussed in operating the memory device 100.

The local memory controller 150 may be operable to perform one or more access operations on one or more memory cells 105 of the memory device 100. Examples of access operations may include a write operation, a read operation, a refresh operation, a precharge operation, or an activate operation, among others. In some examples, access operations may be performed by or otherwise coordinated by the local memory controller 150 in response to access commands (e.g., from a host device). The local memory controller 150 may be operable to perform other access operations not listed here or other operations related to the operating of the memory device 100 that are not directly related to accessing the memory cells 105.

The memory device 100 may include any quantity of non-transitory computer readable media that support improved techniques for multi-level memory cell programming. For example, a local memory controller 150, a row decoder 110, a column decoder 120, a sense component 130, or an input/output component 140, or any combination thereof may include or may access one or more non-transitory computer readable media storing instructions (e.g., firmware) for performing the functions ascribed herein to the memory device 100. For example, such instructions, if executed by the memory device 100, may cause the memory device 100 to perform one or more associated functions as described herein.

Figure 2:
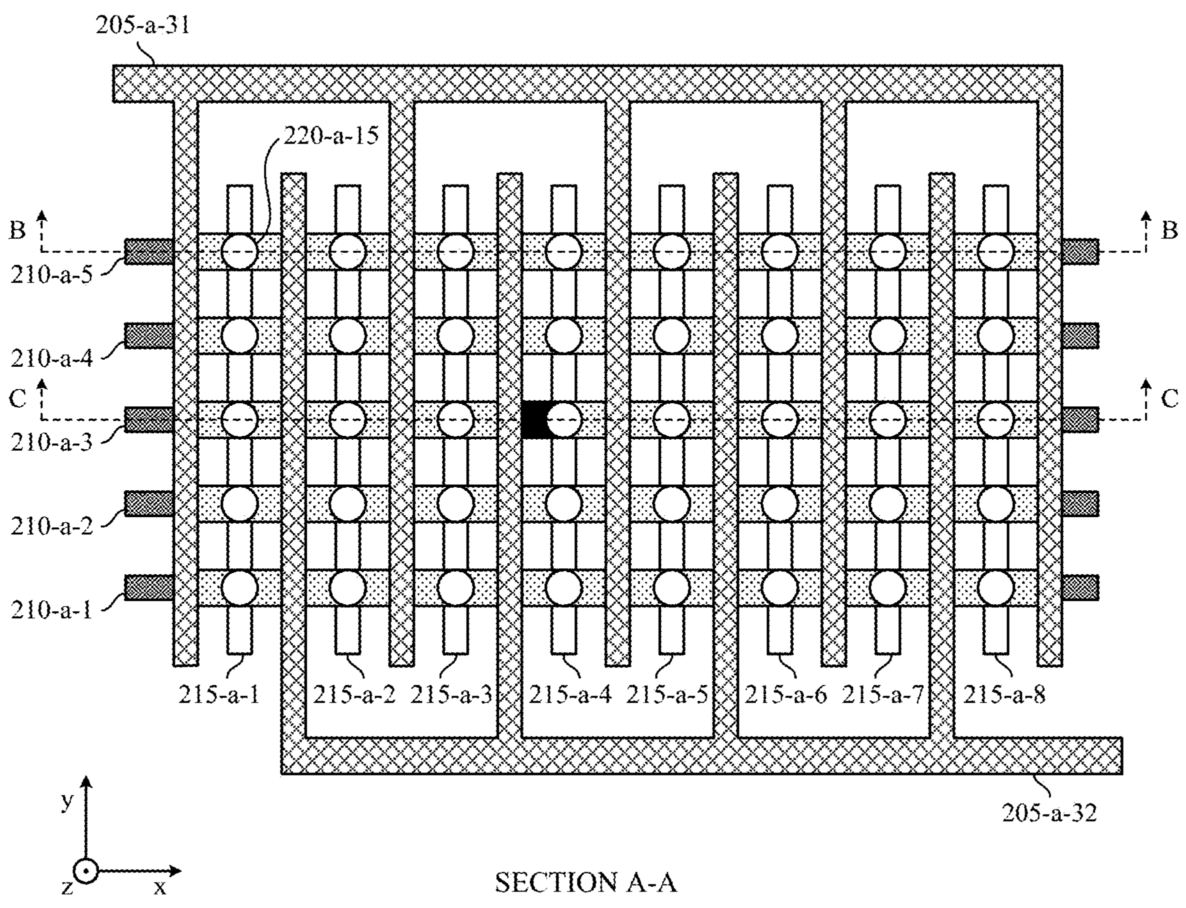
FIG. 2 illustrates a top view of an example of a memory array that supports improved techniques for multi-level memory cell programming in accordance with examples as disclosed herein.
Figure 3A:
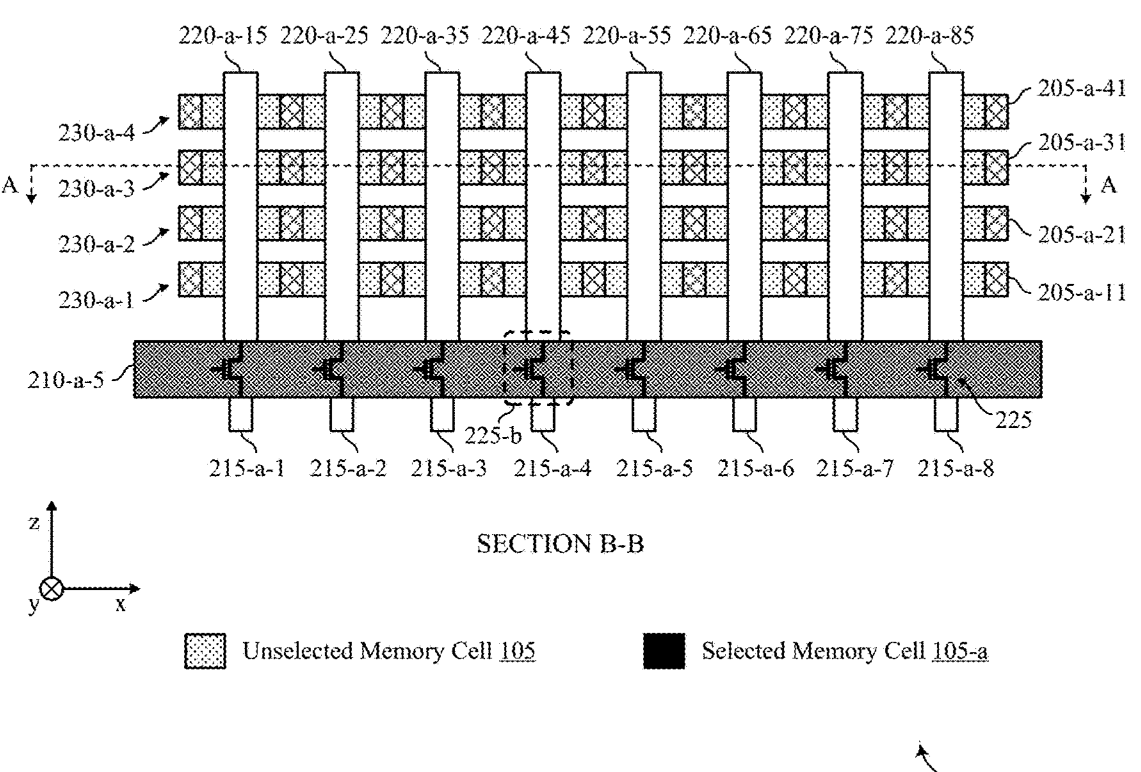
FIGS. 3A and 3B illustrate side views of an example of a memory array that supports improved techniques for multi-level memory cell programming in accordance with examples as disclosed herein.
Figure 3B:
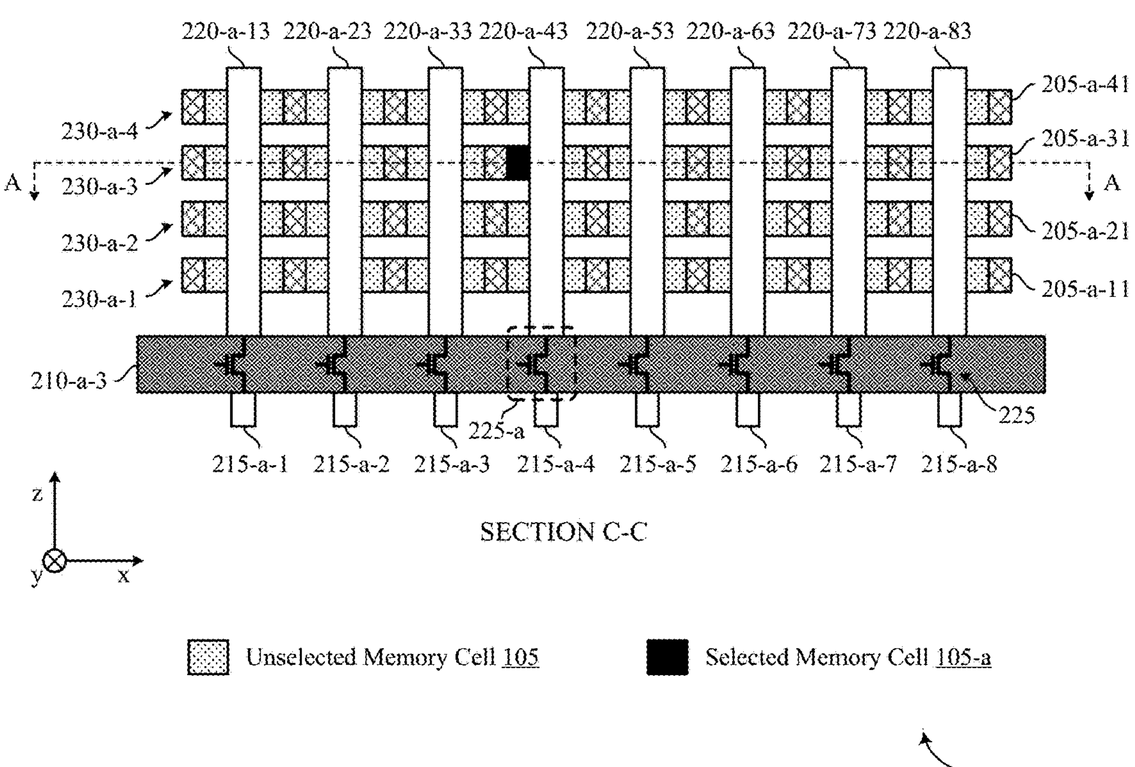

FIGS. 2, 3A, and 3B illustrate an example of a memory array 200 that supports improved techniques for multi-level memory cell programming in accordance with examples as disclosed herein. The memory array 200 may be included in a memory device 100, and illustrates an example of a three-dimensional arrangement of memory cells 105 that may be accessed by various conductive structures (e.g., access lines). FIG. 2 illustrates a top section view (e.g., SECTION A-A) of the memory array 200 relative to a cut plane A-A as shown in FIGS. 3A and 3B. FIG. 3A illustrates a side section view (e.g., SECTION B-B) of the memory array 200 relative to a cut plane B-B as shown in FIG. 2. FIG. 3B illustrates a side section view (e.g., SECTION C-C) of the memory array 200 relative to a cut plane C-C as shown in FIG. 2. The section views may be examples of cross-sectional views of the memory array 200 with some aspects (e.g., dielectric structures) removed for clarity. Elements of the memory array 200 may be described relative to an x-direction, a y-direction, and a z-direction, as illustrated in each of FIGS. 2, 3A, and 3B. Although some elements included in FIGS. 2, 3A, and 3B are labeled with a numeric indicator, other corresponding elements are not labeled, although they are the same or would be understood to be similar, in an effort to increase visibility and clarity of the depicted features. Further, although some quantities of repeated elements are shown in the illustrative example of memory array 200, techniques in accordance with examples as described herein may be applicable to any quantity of such elements, or ratios of quantities between one repeated element and another.

In the example of memory array 200, memory cells 105 and word lines 205 may be distributed along the z-direction according to levels 230 (e.g., decks, layers, planes, tiers, as illustrated in FIGS. 3A and 3B). In some examples, the z-direction may be orthogonal to a substrate (not shown) of the memory array 200, which may be below the illustrated structures along the z-direction. Although the illustrative example of memory array 200 includes four levels 230, a memory array 200 in accordance with examples as disclosed herein may include any quantity of one or more levels 230 (e.g., 64 levels, 128 levels) along the z-direction.

Each word line 205 may be an example of a portion of an access line that is formed by one or more conductive materials (e.g., one or more metal portions, one or more metal alloy portions). As illustrated, a word line 205 may be formed in a comb structure, including portions (e.g., projections, tines) extending along the y-direction through gaps (e.g., alternating gaps) between pillars 220. For example, as illustrated, the memory array 200, may include two word lines 205 per level 230 (e.g., according to odd word lines 205-*a*-*n*1 and even word lines 205-*a*-*n*2 for a given level, n), where such word lines 205 of the same level 230 may be described as being interleaved (e.g., with portions of an odd word line 205-*a*-*n*1 projecting along the y-direction between portions of an even word line 205-*a*-*n*2, and vice versa). In some examples, an odd word line 205 (e.g., of a level 230) may be associated with a first memory cell 105 on a first side (e.g., along the x-direction) of a given pillar 220 and an even word line (e.g., of the same level 230) may be associated with a second memory cell 105 on a second side (e.g., along the x-direction, opposite the first memory cell 105) of the given pillar 220. Thus, in some examples, memory cells 105 of a given level 230 may be addressed (e.g., selected, activated) in accordance with an even word line 205 or an odd word line 205.

Each pillar 220 may be an example of a portion of an access line (e.g., a conductive pillar portion) that is formed by one or more conductive materials (e.g., one or more metal portions, one or more metal alloy portions). As illustrated, the pillars 220 may be arranged in a two-dimensional array (e.g., in an xy-plane) having a first quantity of pillars 220 along a first direction (e.g., eight pillars along the x-direction, eight rows of pillars), and having a second quantity of pillars 220 along a second direction (e.g., five pillars along the y-direction, five columns of pillars). Although the illustrative example of memory array 200 includes a two-dimensional arrangement of eight pillars 220 along the x-direction and five pillars 220 along the y-direction, a memory array 200 in accordance with examples as disclosed herein may include any quantity of pillars 220 along the x-direction and any quantity of pillars 220 along the y-direction. Further, as illustrated, each pillar 220 may be coupled with a respective set of memory cells 105 (e.g., along the z-direction, one or more memory cells 105 for each level 230). A pillar 220 may have a cross-sectional area in an xy-plane that extends along the z-direction. Although illustrated with a circular cross-sectional area in the xy-plane, a pillar 220 may be formed with a different shape, such as having an elliptical, square, rectangular, polygonal, or other cross-sectional area in an xy-plane.

The memory cells 105 each may include a chalcogenide material. In some examples, the memory cells 105 may be examples of thresholding memory cells. Each memory cell 105 may be accessed (e.g., addressed, selected) according to an intersection between a word line 205 (e.g., a level selection, which may include an even or odd selection within a level 230) and a pillar 220. For example, as illustrated, a selected memory cell 105-*a* of the level 230-*a*-3 may be accessed according to an intersection between the pillar 220-*a*-43 and the word line 205-*a*-32.

A memory cell 105 may be accessed (e.g., written to, read from) by applying an access bias (e.g., an access voltage, $V_{access}$, which may be a positive voltage or a negative voltage) across the memory cell 105. In some examples, an access bias may be applied by biasing a selected word line 205 with a first voltage (e.g., $V_{access}/2$) and by biasing a selected pillar 220 with a second voltage (e.g., $-V_{access}/2$), which may have an opposite sign relative to the first voltage. Regarding the selected memory cell 105-*a*, a corresponding access bias (e.g., the first voltage) may be applied to the word line 205-*a*-32, while other unselected word lines 205 may be grounded (e.g., biased to 0V). In some examples, a word line bias may be provided by a word line driver (not shown) coupled with one or more of the word lines 205.

To apply a corresponding access bias (e.g., the second voltage) to a pillar 220, the pillars 220 may be configured to be selectively coupled with a sense line 215 (e.g., a digit line, a column line, an access line extending along the y-direction) via a respective transistor 225 coupled between (e.g., physically, electrically) the pillar 220 and the sense line 215. In some examples, the transistors 225 may be vertical transistors (e.g., transistors having a channel along the z-direction, transistors having a semiconductor junction along the z-direction), which may be formed above the substrate of the memory array 200 using various techniques (e.g., thin film techniques). In some examples, a selected pillar 220, a selected sense line 215, or a combination thereof may be an example of a selected column line 125 described with reference to FIG. 1 (e.g., a bit line).

The transistors 225 (e.g., a channel portion of the transistors 225) may be activated by gate lines 210 (e.g., activation lines, selection lines, a row line, an access line extending along the x-direction) coupled with respective gates of a set of the transistors 225 (e.g., a set along the x-direction). In other words, each of the pillars 220 may have a first end (e.g., towards the negative z-direction, a bottom end) configured for coupling with an access line (e.g., a sense line 215). In some examples, the gate lines 210, the transistors 225, or both may be considered to be components of a row decoder 110 (e.g., as pillar decoder components). In some examples, the selection of (e.g., biasing of) pillars 220, or sense lines 215, or various combinations thereof, may be supported by a column decoder 120, or a sense component 130, or both.

To apply the corresponding access bias (e.g., $-V_{access}/2$) to the pillar 220-*a*-43, the sense line 215-*a*-4 may be biased with the access bias, and the gate line 210-*a*-3 may be grounded (e.g., biased to 0V) or otherwise biased with an activation voltage. In an example where the transistors 225 are n-type transistors, the gate line 210-*a*-3 being biased with a voltage that is relatively higher than the sense line 215-*a*-4 may activate the transistor 225-*a* (e.g., cause the transistor 225-*a* to operate in a conducting state), thereby coupling the pillar 220-*a*-43 with the sense line 215-*a*-4 and biasing the pillar 220-*a*-43 with the associated access bias. However, the transistors 225 may include different channel types, or may be operated in accordance with different biasing schemes, to support various access operations.

In some examples, unselected pillars 220 of the memory array 200 may be electrically floating when the transistor 225-*a* is activated, or may be coupled with another voltage source (e.g., grounded, via a high-resistance path, via a leakage path) to avoid a voltage drift of the pillars 220. For example, a ground voltage being applied to the gate line 210-*a*-3 may not activate other transistors coupled with the gate line 210-*a*-3, because the ground voltage of the gate line 210-*a*-3 may not be greater than the voltage of the other sense lines 215 (e.g., which may be biased with a ground voltage or may be floating). Further, other unselected gate lines 210, including gate line 210-*a*-5 as shown in FIG. 3A, may be biased with a voltage equal to or similar to an access bias (e.g., $-V_{access}/2$, or some other negative bias or bias relatively near the access bias voltage), such that transistors 225 along an unselected gate line 210 are not activated. Thus, the transistor 225-*b* coupled with the gate line 210-*a*-5 may be deactivated (e.g., operating in a non-conductive state), thereby isolating the voltage of the sense line 215-*a*-4 from the pillar 220-*a*-45, among other pillars 220.

In a write operation, a memory cell 105 may be written to by applying a write bias (e.g., where $V_{access}=V_{write}$, which may be a positive voltage or a negative voltage) across the memory cell 105. In some examples, a polarity of a write bias may influence (e.g., determine, set, program) a behavior or characteristic of the material of the memory cell 105, such as the threshold voltage of the material. For example, applying a write bias with a first polarity may set the material of the memory cell 105 with a first threshold voltage, which may be associated with storing a logic 0. Further, applying a write bias with a second polarity (e.g., opposite the first polarity) may set the material of the memory cell with a second threshold voltage, which may be associated with storing a logic 1. A difference between threshold voltages of the material of the memory cell 105 for different logic states stored by the material of the memory cell 105 (e.g., a difference between threshold voltages when the material is storing a logic state '0' versus a logic state '1') may correspond to the read window of the memory cell 105.

In some cases, a write operation may include one or more write biases (e.g., programming pulses) with a same polarity. For example, as an alternative to flipping a polarity of a programming pulse, a memory device may vary an energy of the one or more programming pulses based on a logic state to be stored in the memory cell 105. In some cases, the energy of the one or more programming pulses may correspond to a logic state. In some cases, the energy of the one or more programming pulses may be associated with a current of the one or more programming pulses, a voltage of the one or more programming pulses, a quantity of the one or more programming pulses, or a duration of the one or more programming pulses, or a combination thereof. For example, the memory device or the local memory controller 150 may apply a programming pulse with a relatively short duration to store an intermediate state in the memory cell 105. In some other cases, the memory device or the local memory controller 150 may apply a programming pulse with a relatively long duration to store a SET state in the memory cell 105. In both cases, the programming pulses may have a same polarity.

In a read operation, a memory cell 105 may be read from by applying a read bias (e.g., where $V_{access}=V_{read}$, which may be a positive voltage or a negative voltage) across the memory cell 105. In some examples, a logic state of the memory cell 105 may be evaluated based on whether the memory cell 105 thresholds in the presence of the applied read bias. For example, such a read bias may cause a memory cell 105 storing a first logic state (e.g., a logic 0) to threshold (e.g., permit a current flow, permit a current above a threshold current), and may not cause a memory cell 105 storing a second logic state (e.g., a logic 1) to threshold (e.g., may not permit a current flow, may permit a current below a threshold current).

Figure 4A:
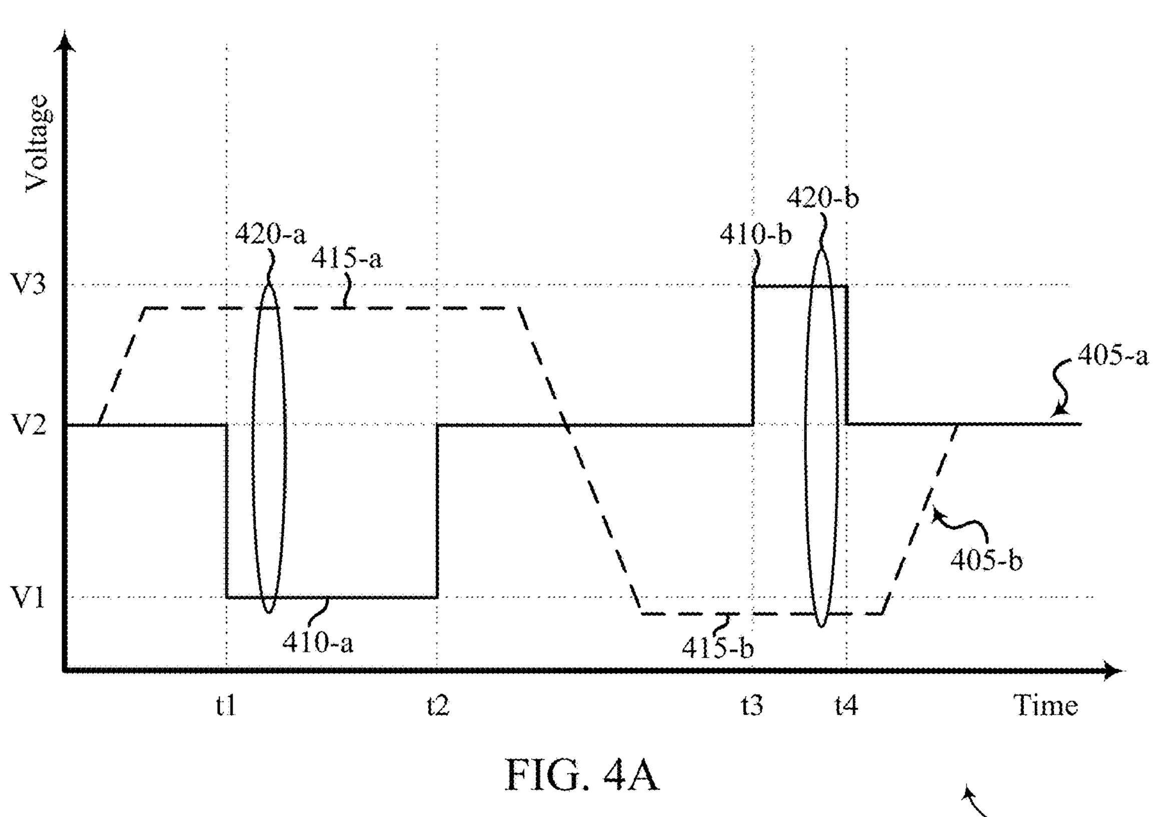
FIG. 4A illustrates an example of a timing diagram that supports improved techniques for multi-level memory cell programming in accordance with examples as disclosed herein.

FIG. 4A illustrates an example of a timing diagram 400 that supports improved techniques for multi-level memory cell programming in accordance with examples as disclosed herein. The timing diagram 400 may include a pulse sequence 405-*a*, which may be associated with one or more pulses applied to a digit line (e.g., a sense line 215) of a memory cell 105. Additionally or alternatively, the timing diagram 400 may include a pulse sequence 405-*b*, which may be associated with a corresponding voltage response at a word line (e.g., a gate line 210) of the memory cell 105. The pulse sequence 405-*a* may include pulse 410-*a* and pulse 410-*b*, which may be applied to the digit line of the memory cell 105. The pulse sequence 405-*b* may include a pulse 415-*a* and a pulse 415-*b*, which may be associated with the word line of the memory cell 105.

As described herein, one or more pulses 420 may be applied to the memory cell 105 by routing a current through one or more access lines coupled with the memory cell 105. The memory cell 105 may be coupled to one or more access lines including a digit line, a word line, or any other access line. In some cases, a digit line may be associated with a lower intrinsic capacitance when compared with a word line. Accordingly, a digit line may have a faster voltage response than a word line, which may be desirable for efficiently applying the pulses 420 to the memory cell 105. For example, the pulse 410-*a* may be applied to the digit line of the memory cell 105, which may cause a voltage of the digit line to change from a second voltage, V2, to a first voltage, V1, at a first time, t1. In some cases, a voltage of a word line may exhibit a slower voltage response due to the relatively large intrinsic capacitance of the word line, as shown by the pulse sequence 405-*b*. To apply one or more of the programming pulses described herein, the word line may be moved to a relatively stable voltage or current and specific changes to the characteristics of the pulse may be controlled by applying different voltages or currents to the digit line.

In some cases, applying a pulse 420 to the memory cell may include applying a pulse 410 to the digit line of the memory cell 105 and applying a pulse 415 on the word line of the memory cell 105. For example, the pulse sequence 405-*b* may be a pulse sequence 405-*b* corresponding to one or more voltages applied to the word line of the memory cell 105. In some cases, applying a pulse 420-*a* with a first polarity to a memory cell may include applying a first pulse 410-*a* to the digit line of the memory cell 105 applying a second pulse 415-*a* to the word line of the memory cell 105 that has a voltage value that is less than the voltage value of the first pulse 410-*a*. Conversely, applying a pulse 420-*b* with a second polarity to the memory cell may include applying a third pulse 410-*b* to the digit line of the memory cell 105 and applying a fourth pulse 415-*b* to the word line of the memory cell 105 that has a voltage value that is less than the voltage value of the third pulse 410-*b*. For example, the pulse 420-*a* may have a positive polarity and the pulse 420-*b* may have a negative polarity.

A pulse 420 may be applied to the memory cell 105 (e.g., via the digit line) as part of an access operation. For example, a pulse 420 may be applied to the memory cell 105 to store a logic state in the memory cell 105, erase a logic state from the memory cell 105, read a logic state stored in the memory cell 105, reprogram the memory cell 105, or for any other access operation. In some cases, the pulse 420-*a* may be applied to the memory cell 105 as part of an asynchronous access operation, such as a block programming operation. The asynchronous access operation may occur periodically and refresh or reprogram the memory cell 105 to a known logic state. For example, the asynchronous access operation associated with the pulse 410-*a* may be part of or otherwise associated with a drift cancellation (DC) operation. In some cases, the pulse 410-*a* may be part of a block erase program and may program the memory cell 105 to the first logic state (e.g., the RESET state). In some other cases, the pulse 420-*a* may be part of an asynchronous access operation, which may program the memory cell 105 to the third logic state (e.g., the intermediate state).

One or more logic states may be stored in a memory cell 105 using a block programming operation. A block programming operation may include an operation to simultaneously store one or more logic states in multiple memory cells 105 (e.g., a block of memory cells 105, a page of memory cells 105). Additionally or alternatively, a block programming operation may apply to a plurality of memory cells 105 associated with one or more previously stored logic states. For example, a block programming operation may apply to a plurality of memory cells 105 that have previously been erased. In some cases, a block programming operation may improve programming efficiency and reduce programming power. As described herein, the pulse 410-*a* may be part of a block programming operation, such as a block erase operation.

The pulse 420-*b* may associated with a write operation to store the first logic state, the second logic state, or the third logic state in the memory cell 105. The write operation may be different from the asynchronous access operation. In some cases, the memory device or the local memory controller 150 may configure one or more parameters of the pulse 410-*b* based on the logic state to be stored in the memory cell 105. The one or more parameters may include a current of the pulse 420-*b*, a voltage of the pulse 420-*b*, a duration of the pulse 420-*b*, a quantity of pulses 420-*b* applied over a time frame, or any combination thereof. In some cases, the pulse 420-*b* having a lower energy (e.g., a shorter duration, a lower voltage, a lower current, a single pulse 410-*b*) may correspond to programming an intermediate state at the memory cell 105 and the pulse 420-*b* having a higher energy (e.g., a longer duration, a higher voltage, a higher current, multiple pulses 410-*b*) may correspond to programming a SET state at the memory cell 105.

Figure 4B:
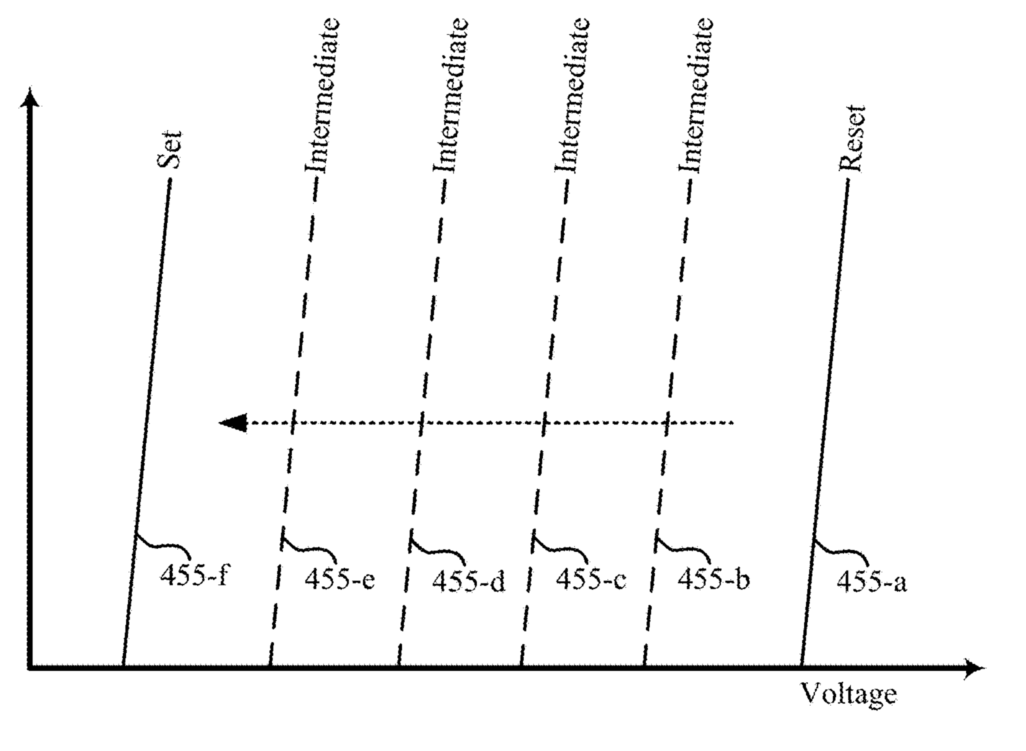
FIG. 4B illustrates an example of a voltage distribution diagram that supports improved techniques for multi-level memory cell programming in accordance with examples as disclosed herein.

FIG. 4B illustrates an example of a voltage distribution diagram 450 that supports improved techniques for multi-level memory cell programming in accordance with examples as disclosed herein. The voltage distribution diagram 450 may include voltage distributions 455 of threshold voltages that may exist at memory cells storing respective logic states. The voltage distribution 455-*b*, the voltage distribution 455-*c*, the voltage distribution 455-*d*, and the voltage distribution 455-*e* may correspond to intermediate logic states. Additionally or alternatively, the voltage distribution 455-*a* may correspond to a RESET logic state and the voltage distribution 455-*f* may correspond to a SET logic state. For example, a memory cell storing a RESET logic state may have any threshold voltage along the voltage distribution 455-*a*, and different memory cells storing the RESET logic state may have different threshold voltages along the voltage distribution 455-*a*. Similar conditions exist for any voltage distribution described herein. The RESET logic state is described for illustrative purposes only.

In some cases, the pulse 410-*a*, as described with reference to FIG. 4A may program the RESET state, which may be associated with the voltage distribution 455-*a*. In some cases, the pulse 420-*b*, as described with reference to FIG. 4A may program the intermediate state, which may be associated with the voltage distribution 455-*b*, the voltage distribution 455-*c*, the voltage distribution 455-*d*, the voltage distribution 455-*e*, or the SET state, which may be associated with the voltage distribution 455-*f*. For example, one or more parameters associated with the pulse 410-*b* may correspond to a placement of one or more voltage distributions associated with the intermediate state or the SET state. In some cases, as an energy of the pulse 420-*b* increases, voltages associated with corresponding voltage distributions 455 may decrease. For example, the voltage distribution 455-*f* may be associated with a pulse 420-*b* with a relatively high energy and voltage distribution 455-*b* may be associated with a pulse 420-*b* with a relatively low energy.

The voltage distributions 455 may be associated with respective logic states stored in the memory cell 105. For example, a voltage distribution 455 may include a plurality of voltages for which a snapback event may occur based on a read pulse. In some cases, a logic state stored in the memory cell 105 may be determined by applying one or more read voltages to the memory cell and monitoring for a snapback event. If a snapback event occurs, the logic state stored in the memory cell may be determined based on a voltage of the read pulse relative to one or more voltages included in a voltage distribution 455. For example, a read pulse may be applied to the memory cell 105 using a voltage greater than or less than one or more voltages included in the voltage distribution 455-*a*. If a snapback event occurs, the logic state stored in the memory cell 105 may be determined based on the read pulse. In some other cases, a plurality of read pulses may be applied to the memory cell 105 and the logic state stored in the memory cell 105 may be determined based on a sequence of the plurality of read pulses.

Voltage distributions 455 may correspond to one or more properties of a storage element in the memory cell 105. For example, voltage distributions 455 may correspond to a physical state of a chalcogenide material. The physical state of the storage element may be associated with an atomic configuration, which may be relatively disordered (e.g., a relatively amorphous state). In some cases, the physical state of the storage element may be associated with one or more short term bonding configurations. Additionally or alternatively, the relatively amorphous state may be associated with one or more different short term bonding configurations. Accordingly, the physical state of the storage element may change over time and one or more voltage distributions 455 may drift as the physical state of the storage element changes. In some cases, performing a write operation at the memory cell 105 may refresh the memory cell and negate the effects of voltage drift.

As described herein, the pulse 420-*a* may be associated with an asynchronous access operation, which may reduce the effects of voltage drift for one or more voltage distributions 455. For example, the pulse 420-*a* may reprogram a logic state in the memory cell 105. In some cases, the pulse 420-*a* may be associated with an asynchronous operation and may store a known (e.g., non-drifted) logic state in the memory cell 105, which may be associated with a voltage distribution 455. Storing the known logic state in the memory cell as part of the asynchronous access operation may enable the memory device to perform a write operation using the pulse 420-*b* without a pre-read operation to determine a previous logic state. For example, the pulse 420-*a* may store the RESET state in the memory cell 105 as part of an asynchronous erase operation.

After storing the RESET state in the memory cell 105 (e.g., using pulse 420-*a*), the pulse 420-*b* may store the intermediate state or the SET state based on an energy of the pulse 420-*b*. For example, applying the pulse 420-*b* with a low energy may store the intermediate state in the memory cell 105, which may correspond to the voltage distribution 455-*b*. Applying the pulse 420-*b* with a high energy state may store the SET state in the memory cell 105, which may correspond to the voltage distribution 455-*f*. More generally, one or more parameters associated with the pulse 420-*b* may be configured to write any logic state to the memory cell 105 corresponding to a voltage distribution 455.

Figure 5A:
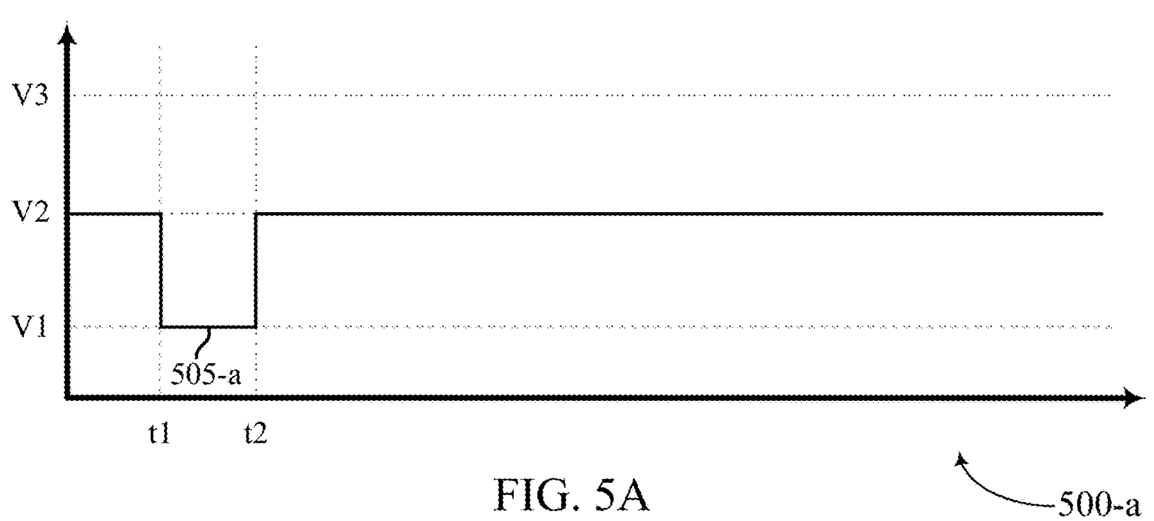
FIGS. 5A, 5B, and 5C illustrate examples of timing diagrams that support improved techniques for multi-level memory cell programming in accordance with examples as disclosed herein.

FIG. 5A illustrates an example of a timing diagram 500-*a* that supports improved techniques for multi-level memory cell programming in accordance with examples as disclosed herein. The timing diagram 500-*a* may include a pulse 505-*a*, which may store a RESET state in the memory cell 105, as described with reference to FIGS. 1, 2, 3A, and 3B. The pulse 505-*a* may have a negative polarity. Additionally or alternatively, the pulse 505-*a* may be applied as part of an asynchronous access operation, such as an asynchronous erase operation.

The pulse 505-*a* may be applied to the memory cell 105. For example, applying the pulse 505-*a* may include routing a current through an access line of the memory cell 105, which may induce a voltage with a negative polarity across the storage element of the memory cell 105. In some cases, the current may be routed through a digit line or a word line. In some cases, the pulse 505-*a* may have a voltage V1, which may be a negative voltage. The voltage V2 may be a zero voltage and the voltage V3 may be a positive voltage. In some cases, the pulse 505-*a* may begin at a first time, t1, and may end and a second time, t2.

Figure 5B:
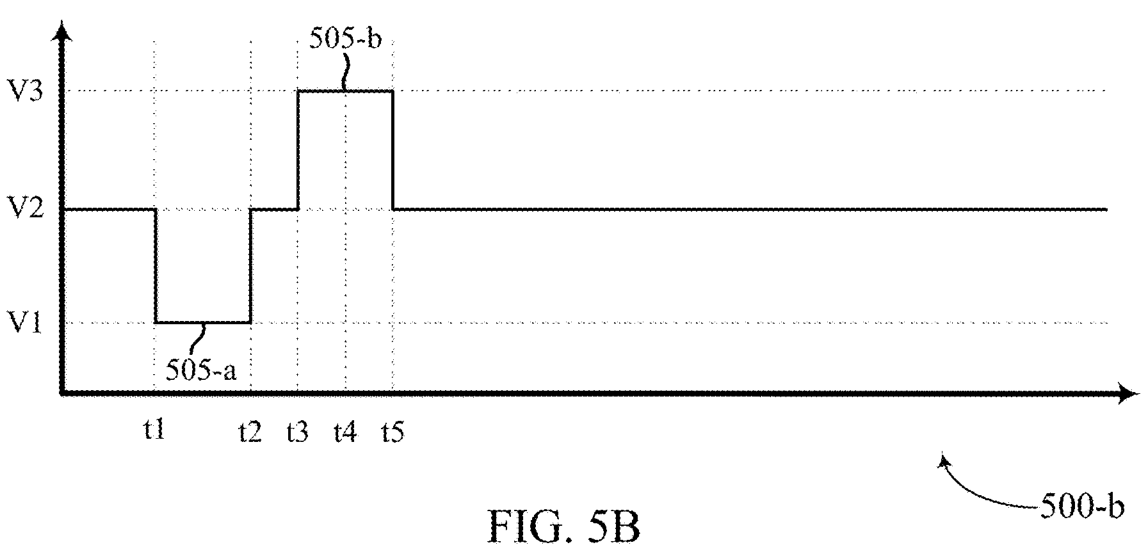

FIG. 5B illustrates an example of a timing diagram 500-*b* that supports improved techniques for multi-level memory cell programming in accordance with examples as disclosed herein. The timing diagram 500-*b* may include the pulse 505-*a*, which may store a RESET state in the memory cell 105. Additionally or alternatively, the timing diagram 500-*b* may include a pulse 505-*b*, which may store a SET state in the memory cell 105. The pulse 505-*a* may have a negative polarity and the pulse 505-*b* may have a positive polarity. The memory device or the local memory controller 150 may configure one or more parameters for the pulse 505-*b*, such as a duration of the pulse 505-*b*, which may correspond to the SET state.

The pulses 505 may be applied to the memory cell 105. For example, applying the pulse 505-*b* may include routing a current through an access line of the memory cell 105, which may induce a voltage with a positive polarity across the storage element of the memory cell 105. In some cases, the current may be routed through a digit line or a word line. In some cases, the pulse 505-*b* may have a voltage V3, which may be a positive voltage. Additionally or alternatively, the voltage V2 may be a zero voltage and the voltage V1 may be a negative voltage. In some cases, the pulse 505-*b* may begin at a third time, t3, and may end at a fifth time, t5.

Figure 5C:
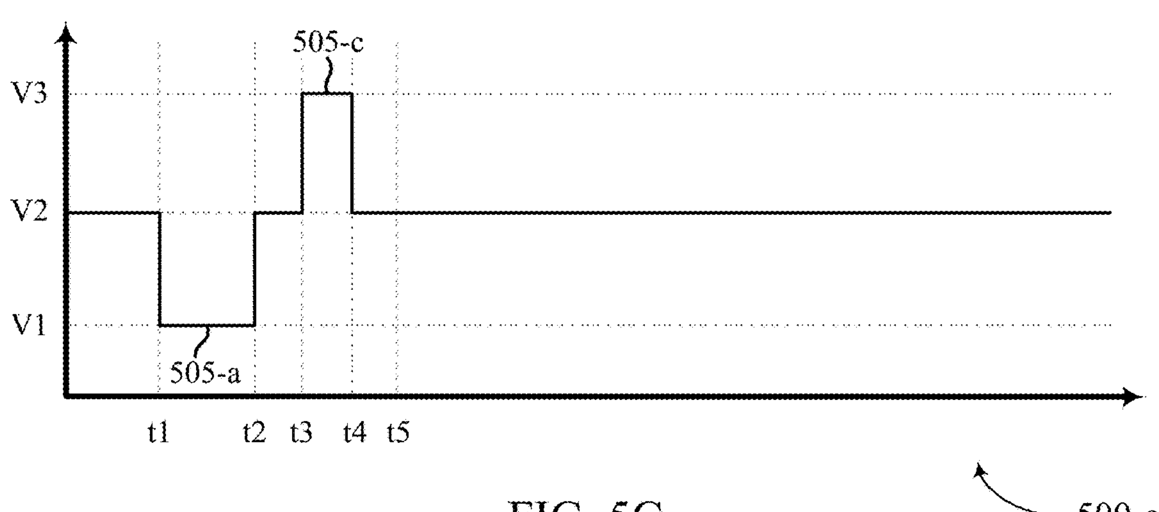

FIG. 5C illustrates an example of a timing diagram 500-*c* that supports improved techniques for multi-level memory cell programming in accordance with examples as disclosed herein. The timing diagram 500-*c* may include the pulse 505-*a*, which may store a RESET state in the memory cell 105. Additionally or alternatively, the timing diagram 500-*b* may include a pulse 505-*c*, which may store an intermediate state in the memory cell 105. The pulse 505-*a* may have a negative polarity and the pulse 505-*c* may have a positive polarity. The memory device (e.g., the local memory controller 150) may configure one or more parameters for the pulse 505-*c*, such as a duration of the pulse 505-*c*, which may correspond to the intermediate state.

The pulses 505 may be applied to the memory cell 105. For example, applying the pulse 505-*c* may include routing a current through an access line of the memory cell 105, which may induce a voltage with a positive polarity across the storage element of the memory cell 105. In some cases, the current may be routed through a digit line or a word line. In some cases, the pulse 505-*c* may have a voltage V3, which may be a positive voltage. Additionally or alternatively, the voltage V2 may be a zero voltage and the voltage V1 may be a negative voltage. In some cases, the pulse 505-*c* may begin at the third time, t3, and may end at a fourth time, t4. In some cases, the pulse 505-*c* may have a shorter duration than the pulse 505-*b*.

In some cases, one or more parameters associated with a pulse 505 may be based on a logic state to be stored in the memory cell 105. For example, the memory device may select a duration of one or more pulses 505, a quantity of one or more pulses 505, a current of one or more pulses 505, a voltage of one or more pulses 505, or any combination thereof. In some cases, the selected one or more parameters associated with the one or more pulses 505 may correspond to a logic state to be stored in the memory cell 105. For example, the duration of the pulses 505 (e.g., the pulse 505-*b* and the pulse 505-*c*) may correspond to a logic state stored in the memory cell 105. The memory device may select a duration of the pulse 505-*b*, which may correspond to storing a SET state in the memory cell 105. Additionally or alternatively, the memory device may select a duration of the pulse 505-*c*, which may correspond to storing an intermediate state in the memory cell 105. That is, there may be a direct relationship between the duration of the pulse 505 and the logic state stored in the memory cell 105. Similarly, other characteristics may be different between pulse 505-*b* and 505-*c* to store different logic states in the memory cell.

FIG. 5B shows an example of the pulse 505-*b* with a duration that is longer than the pulse 505-*c*, as shown with reference to FIG. 5C. In some cases, the memory device may select the duration for the pulse 505-*b* to program the SET state in the memory cell 105. However, in some other cases, the memory device may program the SET state by applying the pulse 505-*b* with a current that corresponds to the SET state, a voltage that corresponds to the SET state, or any combination thereof. For example, although the pulse 505-*b* is shown as having a same voltage as the pulse 505-*c*, in some other cases, the pulse 505-*b* may have a higher voltage than the pulse 505-*c*, which may correspond to the pulse 505-*b* storing the SET state in the memory cell 105. Additionally or alternatively, the memory device my select a quantity of pulses 505 to program a respective logic state in the memory cell 105. For example, the pulse 505-*b* may be a first pulse 505 of a plurality of pulses 505 and the quantity of the plurality of pulses 505 may correspond to storing the SET state in the memory cell 105. Similarly, the pulse 505-*c* may be a first pulse 505 of a plurality of pulses 505 and the quantity of the plurality of pulses 505 may correspond to storing the intermediate state in the memory cell 105.

Figure 6:
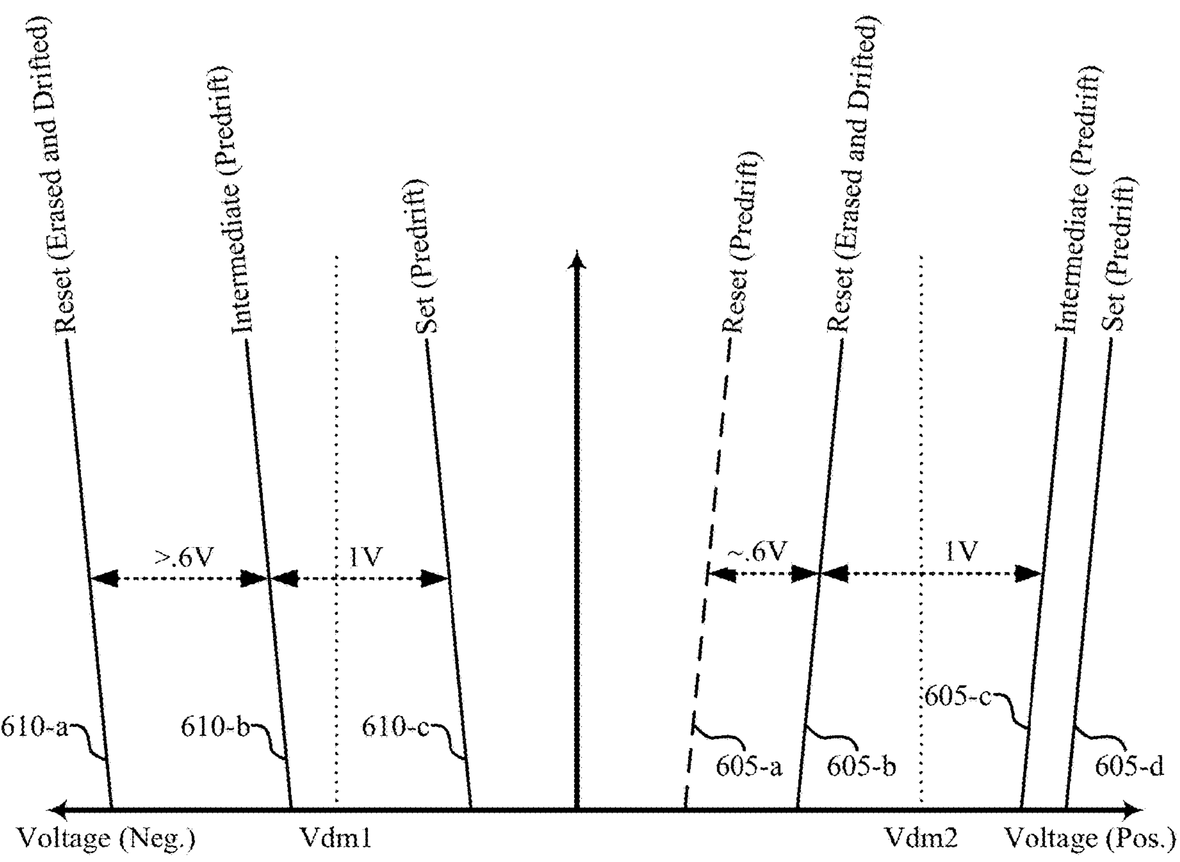
FIG. 6 illustrates an example of a voltage distribution diagram that supports improved techniques for multi-level memory cell programming in accordance with examples as disclosed herein.

FIG. 6 illustrates an example of a voltage distribution diagram 600 that supports improved techniques for multi-level memory cell programming in accordance with examples as disclosed herein. The voltage distribution diagram 600 may include voltage distributions 605 and 610, which may be examples of distributions for read voltages corresponding to respective logic states stored in the memory cell 105. For example, the voltage distribution 605-*a* may include a range of read voltages for which a snapback event may occur when the memory cell 105 stores a RESET logic state. Additionally or alternatively, a snapback event may occur when an absolute value of a read voltage is greater than one or more voltages included in the voltage distribution.

The voltage distribution diagram 600 may include voltage distributions 605 corresponding to positive read voltages (e.g., read voltages with positive polarities) and voltage distributions 610 corresponding to negative read voltages (e.g., read voltages negative polarities). In some cases, as described herein, a logic state may be associated with voltage distributions, which are different for each read voltage polarity. That is, a single logic state may be associated with a voltage distribution 605 for a positive read voltage and a different voltage distribution 610 for a negative read voltage. The voltage distribution 605 for the positive read voltage may be different from the voltage distribution 605 for the negative read voltage. Such a characteristic may be used to identify whether a memory cell is storing an intermediate state. For example, by applying read pulses of different polarities, the memory device may be configured to distinguish between three states instead of just two states when a single read pulse is used.

The voltage distribution 610-*a*, the voltage distribution 610-*b*, and the voltage distribution 610-*c* may be associated with one or more negative polarity read voltages. Additionally or alternatively, the voltage distribution 610-*a* may correspond to a RESET state, the voltage distribution 610-*b* may correspond to an intermediate state, and the voltage distribution 610-*c* may correspond to a SET state. In some cases, applying the read voltage Vdm1 may cause a snapback event if a SET state is stored in the memory cell 105. Applying the read voltage Vdm1 may cause the snapback event based on a value of the read voltage being less than any voltage included in the voltage distribution 605-*c*.

The voltage distribution 605-*a*, the voltage distribution 605-*b*, the voltage distribution 605-*c*, and the voltage distribution 605-*d* may be associated with one or more positive polarity read voltages. Additionally or alternatively, the voltage distribution 605-*a* and the voltage distribution 605-*b* may correspond to a RESET state, the voltage distribution 605-*c* may correspond to an intermediate state, and the voltage distribution 605-*d* may correspond to a SET state. In some cases, applying the read voltage Vdm2 may cause a snapback event if a RESET state is stored in the memory cell 105. Applying the read voltage Vdm2 may cause the snapback event based on the read voltage being greater than any voltage included in the voltage distribution 605-*b*.

Voltage distributions 605 and 610 may drift over time. In some cases, voltage drift may be the result of a property or characteristic of the material of the memory cell 105 changing over time if the memory cell 105 is not reprogrammed. In some cases, voltage drift may reduce a read window of the memory cell 105. For example, a separation or spacing between voltage distributions 605 and 610 may decrease. As shown in FIG. 6, each voltage distribution 605 may be associated with one or more read windows. For example, a read window between the voltage distribution 610-*b* and the voltage distribution 610-*c* may be 1 Volt (V).

The voltage distribution diagram 600 may include voltage distributions 605 and 610 that correspond to an asynchronous access operation for programming (e.g., periodically) the RESET state. For example, pulse 505-*a* may program the RESET state that corresponds to the voltage distribution 610-*a* and the voltage distribution 605-*a*. In some cases, the voltage distribution 605-*a* may represent a RESET state before voltage drift has occurred. Additionally or alternatively, the voltage distribution 605-*b* may represent the RESET state after voltage drift has occurred. Similarly, the voltage distribution 610-*a* may represent the RESET state after voltage drift has occurred. In some cases, if the pulse 505-*a* programs the RESET state as part of an asynchronous access operation, the voltage distribution 605-*a* may drift following the asynchronous access operation. In some cases, a read window associated with voltage distributions 605 and 610 may be reduced as a result of voltage drift. For example, as a result of voltage drift associated with the RESET state, a read window between the voltage distribution 605-*b* and the voltage distribution 605-*c* may be 1V. Similarly, as a result of voltage drift associated with the RESET state, a read window between the voltage distribution 610-*a* and the voltage distribution 610-*b* may be greater than 0.6V.

Multi-level memory cells may use more complex read operations to distinguish between three or more states, as compared with distinguishing between two states. In some cases, a memory device may apply a first read pulse (e.g., Vdm1) with a first polarity (e.g., a negative polarity) to a memory cell being read. If the memory cell experiences a snapback event, the memory device may determine that the memory cell stores a SET state (e.g., distribution 610-*c*). If, however, the memory cell fails to experience a snapback event, the memory cell may store either the RESET state (e.g., 610-*a*) or the intermediate state (e.g., 610-*b*). The memory device may apply a second read pulse (e.g., Vdm2) with a second polarity (e.g., a positive polarity) to a memory cell being read. If the memory cell experiences a snapback event, the memory device may determine that the memory stores a RESET state (e.g., distribution 605-*a* or 605-*b*). If, however, the memory cell fails to experience a snapback event, the memory device may determine that the memory cell stores the intermediate state (e.g., distribution 605-*c*) based on the information learned from applying the first read pulse (e.g., Vdm1) and the second read pulse (e.g., Vdm2).

Figure 7A:
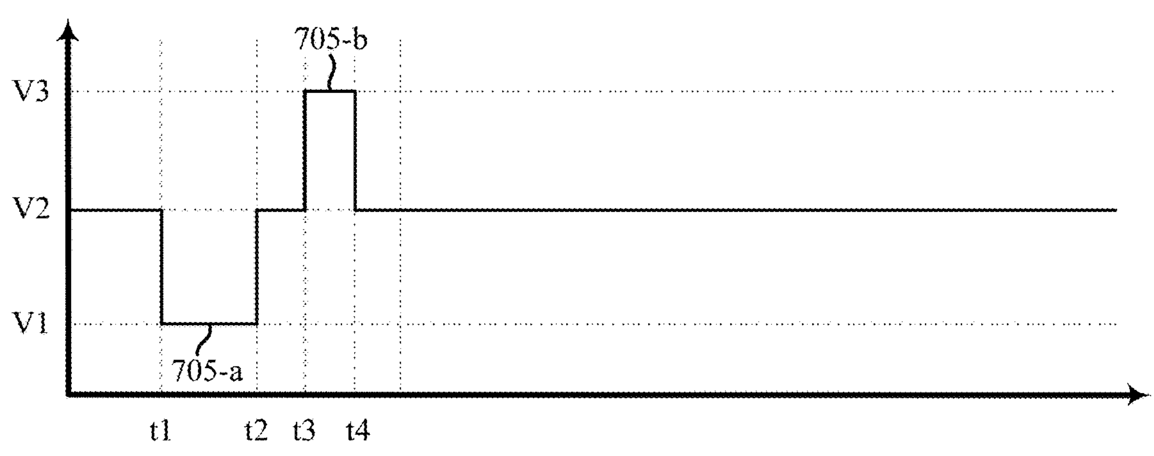
FIGS. 7A, 7B, and 7C illustrate examples of timing diagrams that support improved techniques for multi-level memory cell programming in accordance with examples as disclosed herein.

FIG. 7A illustrates an example of a timing diagram 700-*a* that supports improved techniques for multi-level memory cell programming in accordance with examples as disclosed herein. The timing diagram 700-*a* may include a pulse 705-*a*, which may store a reset state in the memory cell 105, as described with reference to FIGS. 1, 2, 3A, and 3B. The timing diagram 700-*a* may also include a pulse 705-*b*, which may store an intermediate state in the memory cell 105. The pulse 705-*a* may have a negative polarity and the pulse 705-*b* may have a positive polarity. Additionally or alternatively, the pulse 705-*a* and the pulse 705-*b* may be applied as part of an asynchronous access operation. The asynchronous access operation may be performed periodically and may store the intermediate state in the memory cell 105.

The pulse 705-*a* and the pulse 705-*b* may be applied to the memory cell 105. For example, applying the pulse 705-*a* may include routing a current through an access line of the memory cell 105, which may induce a voltage with a negative polarity across the storage element of the memory cell 105. In some cases, the current may be routed through a digit line or a word line. In some cases, the pulse 705-*a* may have a voltage V1, which may be a negative voltage. The pulse 705-*b* may have a voltage V3, which may be a positive voltage. The voltage V2 may be a zero voltage or a non-zero voltage applied to the memory cell 105 in the absence of one or more pulses 705. In some cases, the pulse 705-*a* may begin at a first time, t1, and may end and a second time, t2. The pulse 705-*b* may begin at a third time, t3, and may end at a fourth time, t4.

The asynchronous operation (e.g., erase operation) storing an intermediate state may improve a read window budget for the memory device. Such examples, however, may increase a time it takes to perform the asynchronous operation, as compared with the asynchronous operation that stores the RESET state or the SET state. The asynchronous operation reinforces the intermediate state of the memory cell by increasing the drift of the state (e.g., intermediate state) that can have a bigger impact on read window budget of the memory cell.

Figure 7B:
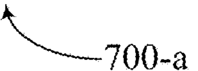
Figure 7B:
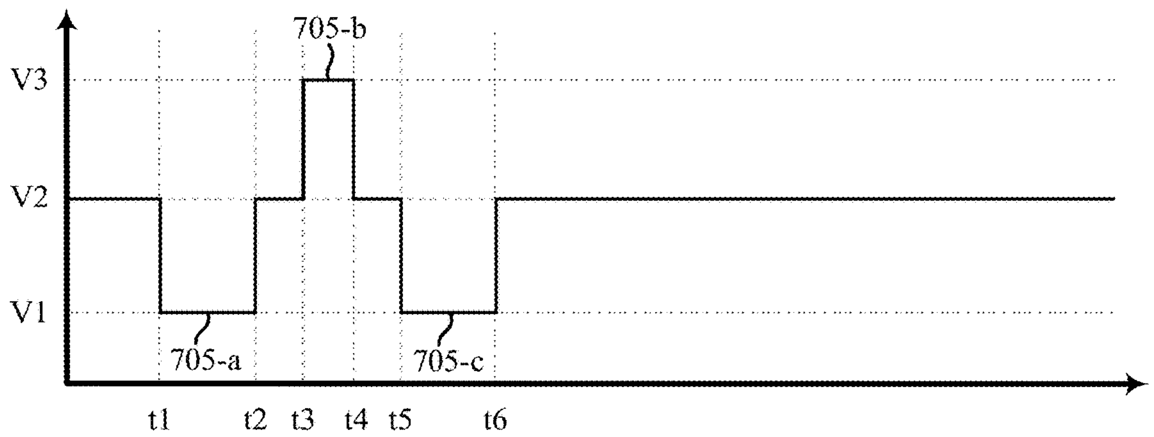

FIG. 7B illustrates an example of a timing diagram 700-*b* that supports improved techniques for multi-level memory cell programming in accordance with examples as disclosed herein. The timing diagram 700-*b* may include the pulse 705-*a*, which may store a RESET state in the memory cell 105, as described with reference to FIGS. 1, 2, 3A, and 3B. The timing diagram 700-*a* may also include a pulse 705-*b*, which may store an intermediate state in the memory cell 105 and a pulse 705-*c*, which may store the RESET state in the memory cell 105. The pulse 705-*a* and the pulse 705-*c* may have negative polarities and the pulse 705-*b* may have a positive polarity. Additionally or alternatively, the pulse 705-*a* and the pulse 705-*b* may be applied as part of an asynchronous access operation. The asynchronous access operation may be performed periodically and may store the intermediate state in the memory cell 105. The pulse 705-*c* may not be applied as part of the asynchronous access operation and may store the RESET state in the memory cell 105.

The pulse 705-*a*, the pulse 705-*b*, and the pulse 705-*c* may be applied to the memory cell 105. For example, applying the pulse 705-*a* may include routing a current through an access line of the memory cell 105, which may induce a voltage with a negative polarity across the storage element of the memory cell 105. In some cases, the current may be routed through a digit line or a word line. In some cases, the pulse 705-*a* may have a voltage V1, which may be a negative voltage. The pulse 705-*b* may have a voltage V3, which may be a positive voltage. The pulse 705-*c* may have the voltage V1. The voltage V2 may be a zero voltage or a non-zero voltage applied to the memory cell 105 in the absence of one or more pulses 705. In some cases, the pulse 705-*a* may begin at a first time, t1, and may end and a second time, t2. The pulse 705-*b* may begin at a third time, t3, and may end at a fourth time, t4. The pulse 705-*c* may begin at a fifth time, t5, and may end at a sixth time, t6.

Figure 7C:
Figure 7C:
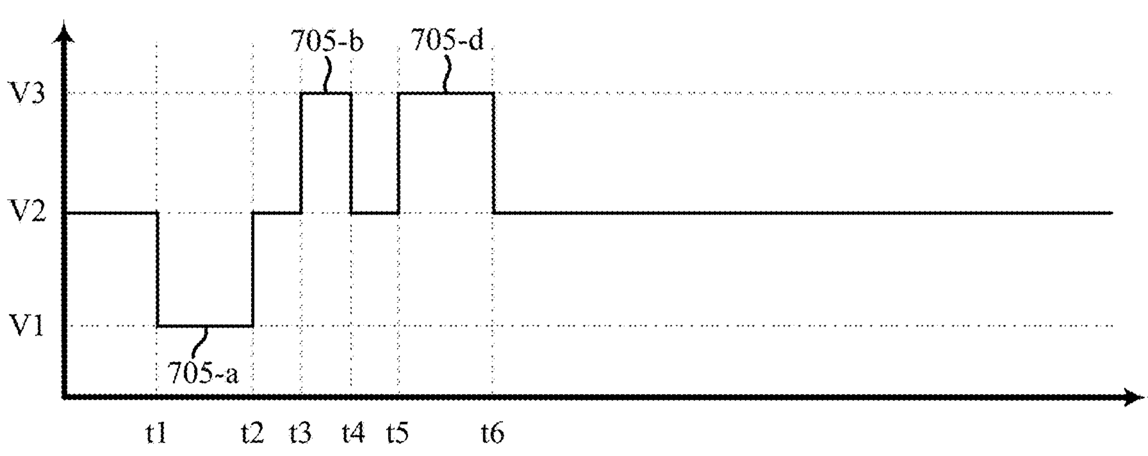

FIG. 7C illustrates an example of a timing diagram 700-*c* that supports improved techniques for multi-level memory cell programming in accordance with examples as disclosed herein. The timing diagram 700-*c* may include the pulse 705-*a*, which may store a RESET state in the memory cell 105, as described with reference to FIGS. 1, 2, 3A, and 3B. The timing diagram 700-*a* may also include a pulse 705-*b*, which may store an intermediate state in the memory cell 105 and a pulse 705-*d*, which may store a SET state in the memory cell 105. The pulse 705-*a* may have a negative polarity. The pulse 705-*b* and the pulse 705-*d* may have positive polarities. Additionally or alternatively, the pulse 705-*a* and the pulse 705-*b* may be applied as part of an asynchronous access operation. The asynchronous access operation may be performed periodically and may store the intermediate state in the memory cell 105. The pulse 705-*d* may not be applied as part of the asynchronous access operation and may store the SET state in the memory cell 105.

The pulse 705-*a*, the pulse 705-*b*, and the pulse 705-*d* may be applied to the memory cell 105. For example, applying the pulse 705-*a* may include routing a current through an access line of the memory cell 105, which may induce a voltage with a negative polarity across the storage element of the memory cell 105. In some cases, the current may be routed through a digit line or a word line. In some cases, the pulse 705-*a* may have a voltage V1, which may be a negative voltage. The pulse 705-*b* and the pulse 705-*d* may have a voltage V3, which may be a positive voltage. The voltage V2 may be a zero voltage or a non-zero voltage applied to the memory cell 105 in the absence of one or more pulses 705. In some cases, the pulse 705-*a* may begin at a first time, t1, and may end and a second time, t2. The pulse 705-*b* may begin at a third time, t3, and may end at a fourth time, t4. The pulse 705-*d* may begin at the fifth time, t5, and may end at the sixth time, t6.

Figure 8:
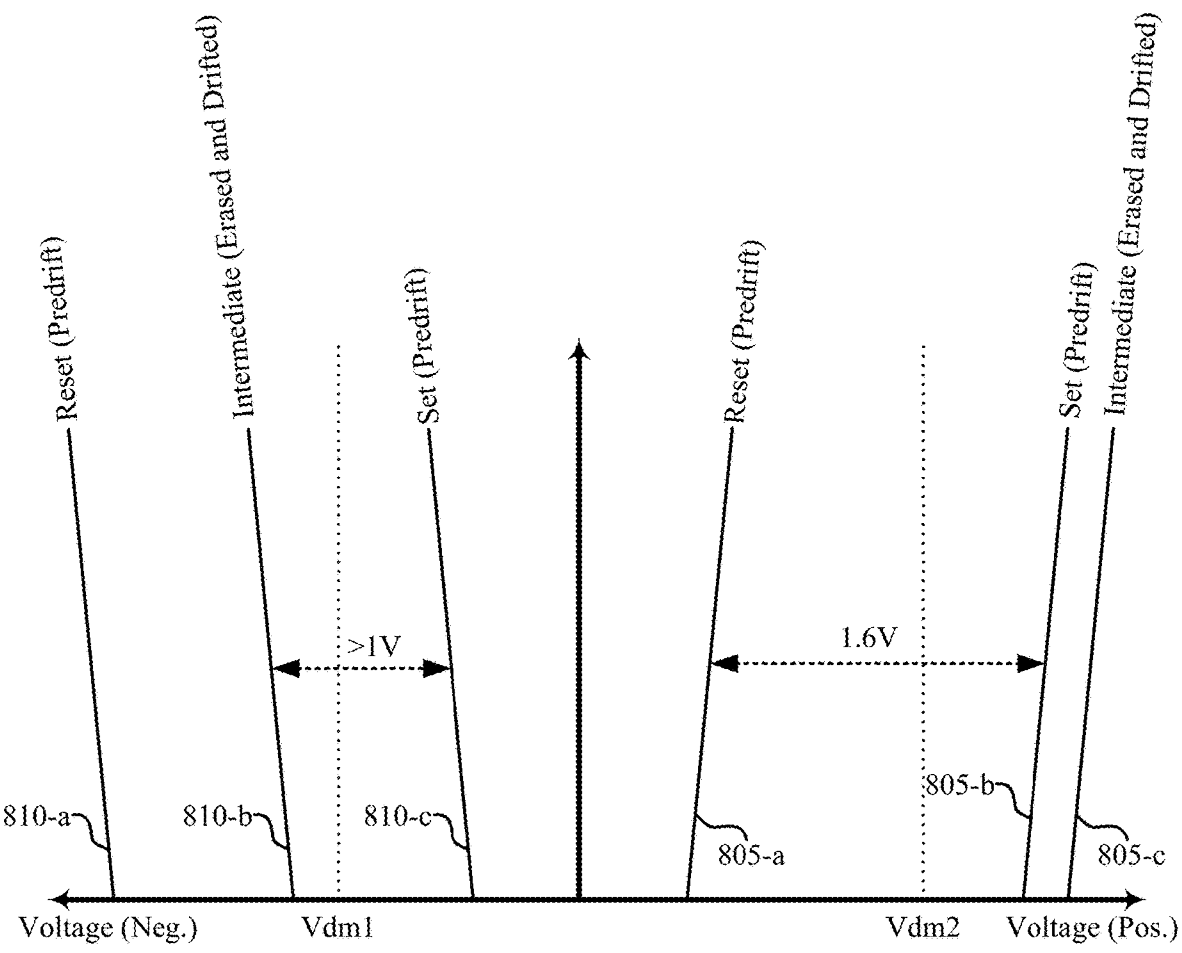
FIG. 8 illustrates an example of a voltage distribution diagram that supports improved techniques for multi-level memory cell programming in accordance with examples as disclosed herein.

FIG. 8 illustrates an example of a voltage distribution diagram 800 that supports improved techniques for multi-level memory cell programming in accordance with examples as disclosed herein. The voltage distribution diagram 800 may include voltage distributions 805 and 810, which may be examples of distributions for read voltages corresponding to respective logic states stored in the memory cell 105. For example, the voltage distribution 805-*a* may include a range of read voltages for which a snapback event may occur when the memory cell 105 stores a RESET logic state. Additionally or alternatively, a snapback event may occur when an absolute value of a read voltage is greater than the voltage distribution.

The voltage distribution diagram 800 may include voltage distributions 805 corresponding to positive read voltages (e.g., read voltages with positive polarities) and voltage distributions 810 corresponding to negative read voltages (e.g., read voltages negative polarities). In some cases, as described herein, a logic state may be associated with voltage distributions 805, which are different for each read voltage polarity. That is, a single logic state may be associated with a voltage distribution 805 for a positive read voltage and a voltage distribution 810 for a negative read voltage. The voltage distribution 805 for the positive read voltage may be different from the voltage distribution 810 for the negative read voltage. Such a characteristic may be used to identify whether a memory cell is storing an intermediate state. For example, by applying read pulses of different polarities, the memory device may be configured to distinguish between three states instead of just two states when a single read pulse is used.

The voltage distribution 810-*a*, the voltage distribution 810-*b*, and the voltage distribution 810-*c* may be associated with one or more negative polarity read voltages. Additionally or alternatively, the voltage distribution 810-*a* may correspond to a RESET state, the voltage distribution 810-*b* may correspond to an intermediate state, and the voltage distribution 810-*c* may correspond to a SET state. In some cases, applying the read voltage Vdm1 may cause a snapback event if a SET state is stored in the memory cell 105. Applying the read voltage Vdm1 may cause the snapback event based on the read voltage being less than any voltage included in the voltage distribution 810-*c*.

The voltage distribution 805-*a*, the voltage distribution 805-*b*, and the voltage distribution 805-*c* may be associated with one or more positive polarity read voltages. Additionally or alternatively, the voltage distribution 805-*a* may correspond to a RESET state, the voltage distribution 805-*b* may correspond to an intermediate state, and the voltage distribution 805-*c* may correspond to a SET state. In some cases, applying the read voltage Vdm2 may cause a snapback event if a RESET state is stored in the memory cell 105. Applying the read voltage Vdm2 may cause the snapback event based on the read voltage being greater than any voltage included in the voltage distribution 805-*a*.

Voltage distributions 805 and 810 may drift over time. In some cases, voltage drift may be the result of a property or characteristic of the material of the memory cell 105 changing over time if the memory cell 105 is not reprogrammed. In some cases, voltage drift may reduce a read window of the memory cell 105. For example, a separation or spacing between voltage distributions 805 and 810 may decrease. Each voltage distribution of the voltage distributions 805 and 810 may be associated with one or more read windows. For example, a read window between the voltage distribution 810-*b* and the voltage distribution 810-*c* may be greater than 1 V.

The voltage distribution diagram 800 may include voltage distributions 805 and 810 that correspond to an asynchronous access operation for programming (e.g., periodically) the intermediate state. For example, pulse 705-*b* may program the intermediate state that corresponds to the voltage distribution 810-*b* and the voltage distribution 805-*c*. In some cases, the voltage distribution 805-*a* and the voltage distribution 805-*c* may represent the intermediate state after voltage drift has occurred. In some cases, if the pulse 705-*b* programs the intermediate state as part of an asynchronous access operation, the voltage distribution 810-*b* may drift following the asynchronous access operation, which may increase a read window between the voltage distribution 810-*b* and the voltage distribution 810-*c*. In some other cases, a read window associated with voltage distributions 805 and 810 may be reduced as a result of voltage drift.

Multi-level memory cells may use more complex read operations to distinguish between three or more states, as compared with distinguishing between two states. In some cases, a memory device may apply a first read pulse (e.g., Vdm1) with a first polarity (e.g., a negative polarity) to a memory cell being read. If the memory cell experiences a snapback event, the memory device may determine that the memory cell stores a SET state (e.g., distribution 810-*c*). If, however, the memory cell fails to experience a snapback event, the memory cell may store either the RESET state (e.g., 810-*a*) or the intermediate state (e.g., 810-*b*). The memory device may apply a second read pulse (e.g., Vdm2) with a second polarity (e.g., a positive polarity) to a memory cell being read. If the memory cell experiences a snapback event, the memory device may determine that the memory stores a RESET state (e.g., distribution 805-*a* or 805-*b*). If, however, the memory cell fails to experience a snapback event, the memory device may determine that the memory cell stores the intermediate state (e.g., distribution 805-*c*) based on the information learned from applying the first read pulse (e.g., Vdm1) and the second read pulse (e.g., Vdm2).

Figure 9:
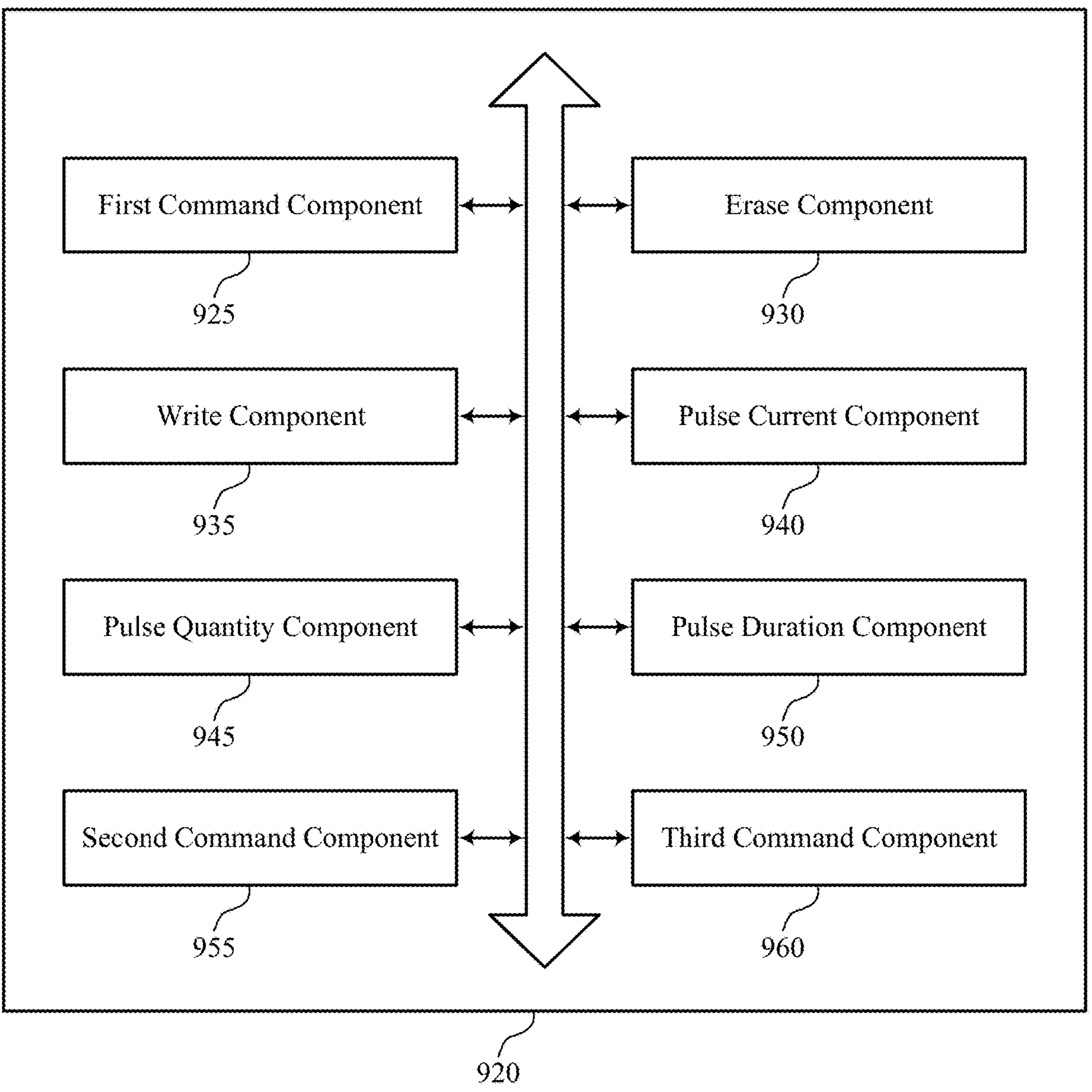
FIG. 9 shows a block diagram of a memory device that supports improved techniques for multi-level memory cell programming in accordance with examples as disclosed herein.

FIG. 9 shows a block diagram 900 of a memory device 920 that supports improved techniques for multi-level memory cell programming in accordance with examples as disclosed herein. The memory device 920 may be an example of aspects of a memory device as described with reference to FIGS. 1 through 8. The memory device 920, or various components thereof, may be an example of means for performing various aspects of improved techniques for multi-level memory cell programming as described herein. For example, the memory device 920 may include a first command component 925, an erase component 930, a write component 935, a pulse current component 940, a pulse quantity component 945, a pulse duration component 950, a second command component 955, a third command component 960, or any combination thereof. Each of these components may communicate, directly or indirectly, with one another (e.g., via one or more buses).

The memory device 920 may support operating a memory array in accordance with examples as disclosed herein. The first command component 925 may be configured as or otherwise support a means for receiving a first command to store a first logic state in a memory cell including a chalcogenide material, where the memory cell is for storing three or more logic states. The erase component 930 may be configured as or otherwise support a means for applying, as part of an erase operation, a first pulse with a first polarity to a plurality of memory cells to store a second logic state different from the first logic state in the plurality of memory cells, the plurality of memory cells including the memory cell. The write component 935 may be configured as or otherwise support a means for applying, as part of a write operation, one or more second pulses with a second polarity to the memory cell to store the first logic state in the memory cell based at least in part on applying the first pulse to the plurality of memory cells.

In some examples, the pulse current component 940 may be configured as or otherwise support a means for identifying a first current for the one or more second pulses that corresponds to the first logic state, where applying the one or more second pulses is based at least in part on identifying the first current.

In some examples, the first current is associated with a duration of the one or more second pulses, a quantity of the one or more second pulses, or any combination thereof.

In some examples, the pulse quantity component 945 may be configured as or otherwise support a means for identifying a quantity of pulses for the one or more second pulses that corresponds to the first logic state, where applying the one or more second pulses is based at least in part on identifying the quantity of pulses.

In some examples, the pulse duration component 950 may be configured as or otherwise support a means for identifying a duration for a pulse of the one or more second pulses, where applying the one or more second pulses is based at least in part on identifying the duration.

In some examples, the second command component 955 may be configured as or otherwise support a means for receiving a second command to store a third logic state in the memory cell including the chalcogenide material. In some examples, the erase component 930 may be configured as or otherwise support a means for applying, as part of the erase operation, the first pulse with the first polarity to the plurality of memory cells to store the second logic state different from the first logic state in the plurality of memory cells. In some examples, the write component 935 may be configured as or otherwise support a means for applying, as part of the write operation, a third pulse with the second polarity to the memory cell to store the third logic state in the memory cell based at least in part on applying the first pulse to the plurality of memory cells.

In some examples, a first current for the third pulse is different than a second current for the one or more second pulses used to program the first logic state.

In some examples, to support applying the one or more second pulses with the second polarity to the memory cell, the write component 935 may be configured as or otherwise support a means for applying a first voltage to a word line coupled with the memory cell. In some examples, to support applying the one or more second pulses with the second polarity to the memory cell, the write component 935 may be configured as or otherwise support a means for applying one or more second voltages to a digit line coupled with the memory cell.

In some examples, the erase operation is an asynchronous operation.

In some examples, the erase operation includes a block erase operation for erasing a block of memory cells. In some examples, the block of memory cells includes the plurality of memory cells.

In some examples, the first logic state includes an intermediate logic state, the second logic state includes a reset state, and a third logic state includes a set state.

In some examples, the erase component 930 may be configured as or otherwise support a means for applying, as part of the erase operation, a fourth pulse with the second polarity, where applying the first pulse with the first polarity is based at least in part on applying the fourth pulse with the second polarity.

In some examples, the three or more logic states for storing by the memory cell include the second logic state associated with a first threshold voltage, a third logic state associated with a second threshold voltage, and the first logic state associated with an intermediate threshold voltage between the first threshold voltage and the second threshold voltage based at least in part on a polarity of the read pulses being the same as the second polarity of the one or more second pulses used to program the first logic state.

Additionally, or alternatively, the memory device 920 may support operating a memory array in accordance with examples as disclosed herein. In some examples, the first command component 925 may be configured as or otherwise support a means for receiving a command to store a first logic state in a memory cell including a chalcogenide material, where the memory cell is for storing three or more logic states including a second logic state associated with a first threshold voltage, a third logic state associated with a second threshold voltage, and the first logic state associated with an intermediate threshold voltage between the first threshold voltage and the second threshold voltage. In some examples, the erase component 930 may be configured as or otherwise support a means for applying, as part of an erase operation, a first pulse with a first polarity to a plurality of memory cells, the plurality of memory cells including the memory cell. In some examples, the erase component 930 may be configured as or otherwise support a means for applying, as part of the erase operation, one or more second pulses with a second polarity to the plurality of memory cells to store the first logic state in the plurality of memory cells based at least in part on applying the first pulse to the plurality of memory cells.

In some examples, the write component 935 may be configured as or otherwise support a means for refraining, as part of a write operation, from applying one or more third pulses to the memory cell based at least in part on applying the one or more second pulses to the plurality of memory cells as part of the erase operation.

In some examples, the pulse current component 940 may be configured as or otherwise support a means for identifying a first current for the one or more second pulses that corresponds to the first logic state, where applying the one or more second pulses is based at least in part on identifying the first current.

In some examples, the first current is associated with a duration of the one or more second pulses, a quantity of the one or more second pulses, or any combination thereof.

In some examples, the pulse quantity component 945 may be configured as or otherwise support a means for identifying a quantity of pulses for the one or more second pulses that corresponds to the first logic state, where applying the one or more second pulses is based at least in part on identifying the quantity of pulses.

In some examples, the pulse duration component 950 may be configured as or otherwise support a means for identifying a duration for a pulse of the one or more second pulses, where applying the one or more second pulses is based at least in part on identifying the duration.

In some examples, the second command component 955 may be configured as or otherwise support a means for receiving a second command to store the second logic state in the memory cell including the chalcogenide material. In some examples, the erase component 930 may be configured as or otherwise support a means for applying the first pulse with the first polarity to the plurality of memory cells to store the second logic state different from the first logic state in the plurality of memory cells.

In some examples, a first current for the first pulse is different than a second current for the one or more second pulses used to program the first logic state.

In some examples, the third command component 960 may be configured as or otherwise support a means for receiving a third command to store the third logic state in the memory cell including the chalcogenide material. In some examples, the write component 935 may be configured as or otherwise support a means for applying, as part of a write operation, a third pulse with the second polarity to the plurality of memory cells to store the second logic state different from the first logic state in the plurality of memory cells.

In some examples, a first current for the third pulse is different than a second current for the one or more second pulses used to program the first logic state.

In some examples, to support applying the one or more second pulses with the second polarity to the memory cell, the erase component 930 may be configured as or otherwise support a means for applying a first voltage to a word line coupled with the memory cell. In some examples, to support applying the one or more second pulses with the second polarity to the memory cell, the erase component 930 may be configured as or otherwise support a means for applying one or more second voltages to a digit line coupled with the memory cell.

In some examples, the erase operation is an asynchronous operation.

In some examples, the erase operation includes a block erase operation for erasing a block of memory cells. In some examples, the block of memory cells includes the plurality of memory cells.

In some examples, the first logic state includes an intermediate logic state, the second logic state includes a reset state, and the third logic state includes a set state.

In some examples, the erase component 930 may be configured as or otherwise support a means for applying, as part of the erase operation, a fourth pulse with the second polarity, where applying the first pulse with the first polarity is based at least in part on applying the fourth pulse with the second polarity.

Figure 10:
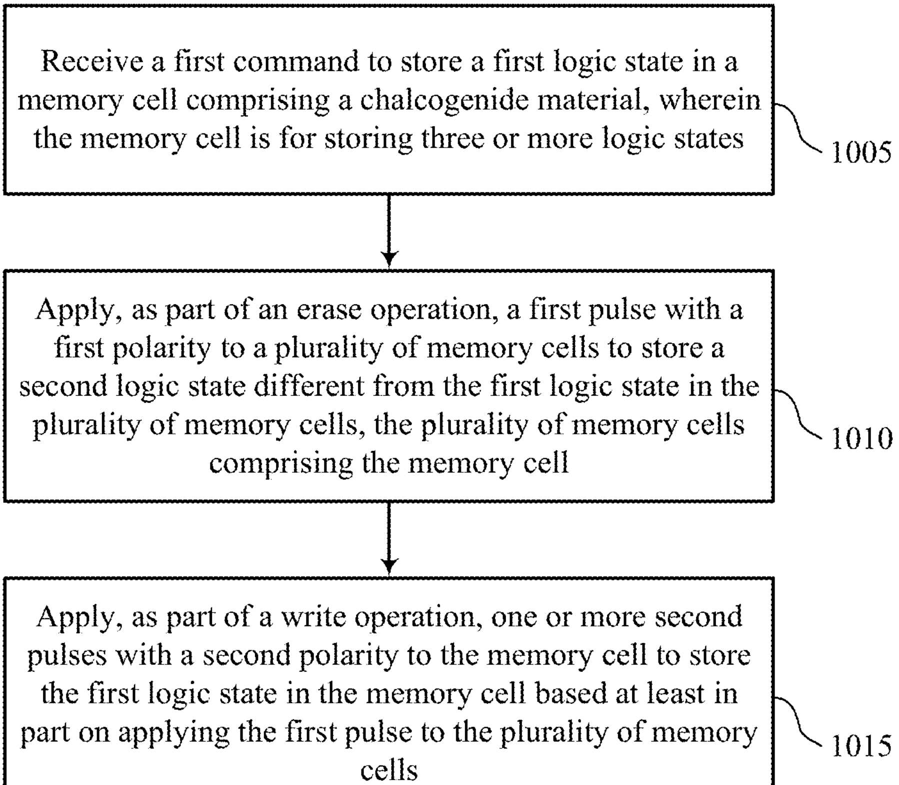

FIG. 10 shows a flowchart illustrating a method 1000 that supports improved techniques for multi-level memory cell programming in accordance with examples as disclosed herein. The operations of method 1000 may be implemented by a memory device or its components as described herein. For example, the operations of method 1000 may be performed by a memory device as described with reference to FIGS. 1 through 9. In some examples, a memory device may execute a set of instructions to control the functional elements of the device to perform the described functions. Additionally, or alternatively, the memory device may perform aspects of the described functions using special-purpose hardware.

At 1005, the method may include receiving a first command to store a first logic state in a memory cell including a chalcogenide material, where the memory cell is for storing three or more logic states. The operations of 1005 may be performed in accordance with examples as disclosed herein. In some examples, aspects of the operations of 1005 may be performed by a first command component 925 as described with reference to FIG. 9.

At 1010, the method may include applying, as part of an erase operation, a first pulse with a first polarity to a plurality of memory cells to store a second logic state different from the first logic state in the plurality of memory cells, the plurality of memory cells including the memory cell. The operations of 1010 may be performed in accordance with examples as disclosed herein. In some examples, aspects of the operations of 1010 may be performed by an erase component 930 as described with reference to FIG. 9.

At 1015, the method may include applying, as part of a write operation, one or more second pulses with a second polarity to the memory cell to store the first logic state in the memory cell based at least in part on applying the first pulse to the plurality of memory cells. The operations of 1015 may be performed in accordance with examples as disclosed herein. In some examples, aspects of the operations of 1015 may be performed by a write component 935 as described with reference to FIG. 9.

In some examples, an apparatus as described herein may perform a method or methods, such as the method 1000. The apparatus may include features, circuitry, logic, means, or instructions (e.g., a non-transitory computer-readable medium storing instructions executable by a processor), or any combination thereof for performing the following aspects of the present disclosure:

Aspect 1: A method, apparatus, or non-transitory computer-readable medium including operations, features, circuitry, logic, means, or instructions, or any combination thereof for receiving a first command to store a first logic state in a memory cell including a chalcogenide material, where the memory cell is for storing three or more logic states; applying, as part of an erase operation, a first pulse with a first polarity to a plurality of memory cells to store a second logic state different from the first logic state in the plurality of memory cells, the plurality of memory cells including the memory cell; and applying, as part of a write operation, one or more second pulses with a second polarity to the memory cell to store the first logic state in the memory cell based at least in part on applying the first pulse to the plurality of memory cells.

Aspect 2: The method, apparatus, or non-transitory computer-readable medium of aspect 1, further including operations, features, circuitry, logic, means, or instructions, or any combination thereof for identifying a first current for the one or more second pulses that corresponds to the first logic state, where applying the one or more second pulses is based at least in part on identifying the first current.

Aspect 3: The method, apparatus, or non-transitory computer-readable medium of aspect 2 where the first current is associated with a duration of the one or more second pulses, a quantity of the one or more second pulses, or any combination thereof.

Aspect 4: The method, apparatus, or non-transitory computer-readable medium of any of aspects 1 through 3, further including operations, features, circuitry, logic, means, or instructions, or any combination thereof for identifying a quantity of pulses for the one or more second pulses that corresponds to the first logic state, where applying the one or more second pulses is based at least in part on identifying the quantity of pulses.

Aspect 5: The method, apparatus, or non-transitory computer-readable medium of any of aspects 1 through 4, further including operations, features, circuitry, logic, means, or instructions, or any combination thereof for identifying a duration for a pulse of the one or more second pulses, where applying the one or more second pulses is based at least in part on identifying the duration.

Aspect 6: The method, apparatus, or non-transitory computer-readable medium of any of aspects 1 through 5, further including operations, features, circuitry, logic, means, or instructions, or any combination thereof for receiving a second command to store a third logic state in the memory cell including the chalcogenide material; applying, as part of the erase operation, the first pulse with the first polarity to the plurality of memory cells to store the second logic state different from the first logic state in the plurality of memory cells; and applying, as part of the write operation, a third pulse with the second polarity to the memory cell to store the third logic state in the memory cell based at least in part on applying the first pulse to the plurality of memory cells.

Aspect 7: The method, apparatus, or non-transitory computer-readable medium of aspect 6 where a first current for the third pulse is different than a second current for the one or more second pulses used to program the first logic state.

Aspect 8: The method, apparatus, or non-transitory computer-readable medium of any of aspects 1 through 7 where applying the one or more second pulses with the second polarity to the memory cell, further includes operations, features, circuitry, logic, means, or instructions, or any combination thereof for applying a first voltage to a word line coupled with the memory cell and applying one or more second voltages to a digit line coupled with the memory cell.

Aspect 9: The method, apparatus, or non-transitory computer-readable medium of any of aspects 1 through 8 where the erase operation is an asynchronous operation.

Aspect 10: The method, apparatus, or non-transitory computer-readable medium of any of aspects 1 through 9 where the erase operation includes a block erase operation for erasing a block of memory cells and the block of memory cells includes the plurality of memory cells.

Aspect 11: The method, apparatus, or non-transitory computer-readable medium of any of aspects 1 through 10 where the first logic state includes an intermediate logic state, the second logic state includes a reset state, and a third logic state includes a set state.

Aspect 12: The method, apparatus, or non-transitory computer-readable medium of any of aspects 1 through 11, further including operations, features, circuitry, logic, means, or instructions, or any combination thereof for applying, as part of the erase operation, a fourth pulse with the second polarity, where applying the first pulse with the first polarity is based at least in part on applying the fourth pulse with the second polarity.

Aspect 13: The method, apparatus, or non-transitory computer-readable medium of any of aspects 1 through 12 where the three or more logic states for storing by the memory cell include the second logic state associated with a first threshold voltage, a third logic state associated with a second threshold voltage, and the first logic state associated with an intermediate threshold voltage between the first threshold voltage and the second threshold voltage based at least in part on a polarity of the read pulses being the same as the second polarity of the one or more second pulses used to program the first logic state.

FIG. 11 shows a flowchart illustrating a method 1100 that supports improved techniques for multi-level memory cell programming in accordance with examples as disclosed herein. The operations of method 1100 may be implemented by a memory device or its components as described herein. For example, the operations of method 1100 may be performed by a memory device as described with reference to FIGS. 1 through 9. In some examples, a memory device may execute a set of instructions to control the functional elements of the device to perform the described functions. Additionally, or alternatively, the memory device may perform aspects of the described functions using special-purpose hardware.

At 1105, the method may include receiving a command to store a first logic state in a memory cell including a chalcogenide material, where the memory cell is for storing three or more logic states including a second logic state associated with a first threshold voltage, a third logic state associated with a second threshold voltage, and the first logic state associated with an intermediate threshold voltage between the first threshold voltage and the second threshold voltage. The operations of 1105 may be performed in accordance with examples as disclosed herein. In some examples, aspects of the operations of 1105 may be performed by a first command component 925 as described with reference to FIG. 9.

At 1110, the method may include applying, as part of an erase operation, a first pulse with a first polarity to a plurality of memory cells, the plurality of memory cells including the memory cell. The operations of 1110 may be performed in accordance with examples as disclosed herein. In some examples, aspects of the operations of 1110 may be performed by an erase component 930 as described with reference to FIG. 9.

At 1115, the method may include applying, as part of the erase operation, one or more second pulses with a second polarity to the plurality of memory cells to store the first logic state in the plurality of memory cells based at least in part on applying the first pulse to the plurality of memory cells. The operations of 1115 may be performed in accordance with examples as disclosed herein. In some examples, aspects of the operations of 1115 may be performed by an erase component 930 as described with reference to FIG. 9.

In some examples, an apparatus as described herein may perform a method or methods, such as the method 1100. The apparatus may include features, circuitry, logic, means, or instructions (e.g., a non-transitory computer-readable medium storing instructions executable by a processor), or any combination thereof for performing the following aspects of the present disclosure:

Aspect 14: A method, apparatus, or non-transitory computer-readable medium including operations, features, circuitry, logic, means, or instructions, or any combination thereof for receiving a command to store a first logic state in a memory cell including a chalcogenide material, where the memory cell is for storing three or more logic states including a second logic state associated with a first threshold voltage, a third logic state associated with a second threshold voltage, and the first logic state associated with an intermediate threshold voltage between the first threshold voltage and the second threshold voltage; applying, as part of an erase operation, a first pulse with a first polarity to a plurality of memory cells, the plurality of memory cells including the memory cell; and applying, as part of the erase operation, one or more second pulses with a second polarity to the plurality of memory cells to store the first logic state in the plurality of memory cells based at least in part on applying the first pulse to the plurality of memory cells.

Aspect 15: The method, apparatus, or non-transitory computer-readable medium of aspect 14, further including operations, features, circuitry, logic, means, or instructions, or any combination thereof for refraining, as part of a write operation, from applying one or more third pulses to the memory cell based at least in part on applying the one or more second pulses to the plurality of memory cells as part of the erase operation.

Aspect 16: The method, apparatus, or non-transitory computer-readable medium of any of aspects 14 through 15, further including operations, features, circuitry, logic, means, or instructions, or any combination thereof for identifying a first current for the one or more second pulses that corresponds to the first logic state, where applying the one or more second pulses is based at least in part on identifying the first current.

Aspect 17: The method, apparatus, or non-transitory computer-readable medium of aspect 16 where the first current is associated with a duration of the one or more second pulses, a quantity of the one or more second pulses, or any combination thereof.

Aspect 18: The method, apparatus, or non-transitory computer-readable medium of any of aspects 14 through 17, further including operations, features, circuitry, logic, means, or instructions, or any combination thereof for identifying a quantity of pulses for the one or more second pulses that corresponds to the first logic state, where applying the one or more second pulses is based at least in part on identifying the quantity of pulses.

Aspect 19: The method, apparatus, or non-transitory computer-readable medium of any of aspects 14 through 18, further including operations, features, circuitry, logic, means, or instructions, or any combination thereof for identifying a duration for a pulse of the one or more second pulses, where applying the one or more second pulses is based at least in part on identifying the duration.

Aspect 20: The method, apparatus, or non-transitory computer-readable medium of any of aspects 14 through 19, further including operations, features, circuitry, logic, means, or instructions, or any combination thereof for receiving a second command to store the second logic state in the memory cell including the chalcogenide material and applying the first pulse with the first polarity to the plurality of memory cells to store the second logic state different from the first logic state in the plurality of memory cells.

Aspect 21: The method, apparatus, or non-transitory computer-readable medium of aspect 20 where a first current for the first pulse is different than a second current for the one or more second pulses used to program the first logic state.

Aspect 22: The method, apparatus, or non-transitory computer-readable medium of any of aspects 14 through 21, further including operations, features, circuitry, logic, means, or instructions, or any combination thereof for receiving a third command to store the third logic state in the memory cell including the chalcogenide material and applying, as part of a write operation, a third pulse with the second polarity to the plurality of memory cells to store the second logic state different from the first logic state in the plurality of memory cells.

Aspect 23: The method, apparatus, or non-transitory computer-readable medium of aspect 22 where a first current for the third pulse is different than a second current for the one or more second pulses used to program the first logic state.

Aspect 24: The method, apparatus, or non-transitory computer-readable medium of any of aspects 14 through 23 where applying the one or more second pulses with the second polarity to the memory cell, further includes operations, features, circuitry, logic, means, or instructions, or any combination thereof for applying a first voltage to a word line coupled with the memory cell and applying one or more second voltages to a digit line coupled with the memory cell.

Aspect 25: The method, apparatus, or non-transitory computer-readable medium of any of aspects 14 through 24 where the erase operation is an asynchronous operation.

Aspect 26: The method, apparatus, or non-transitory computer-readable medium of any of aspects 14 through 25 where the erase operation includes a block erase operation for erasing a block of memory cells and the block of memory cells includes the plurality of memory cells.

Aspect 27: The method, apparatus, or non-transitory computer-readable medium of any of aspects 14 through 26 where the first logic state includes an intermediate logic state, the second logic state includes a reset state, and the third logic state includes a set state.

Aspect 28: The method, apparatus, or non-transitory computer-readable medium of any of aspects 14 through 27, further including operations, features, circuitry, logic, means, or instructions, or any combination thereof for applying, as part of the erase operation, a fourth pulse with the second polarity, where applying the first pulse with the first polarity is based at least in part on applying the fourth pulse with the second polarity.

It should be noted that the methods described herein describe possible implementations, and that the operations and the steps may be rearranged or otherwise modified and that other implementations are possible. Further, portions from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a general-purpose processor, a digital signal processor (DSP), an application-specific integrated circuit (ASIC), a field-programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method for operating a memory array, comprising:

receiving a first command to store a first logic state in a memory cell comprising a chalcogenide material, wherein the memory cell is for storing three or more logic states;

applying, as part of an erase operation, an initial pulse with a first polarity to a plurality of memory cells;

applying, as part of the erase operation and based at least in part on applying the initial pulse with the first polarity, a first pulse with a second polarity to the plurality of memory cells for a first duration to store a second logic state different from the first logic state in the plurality of memory cells, the plurality of memory cells comprising the memory cell; and applying, as part of a write operation, one or more second pulses with the first polarity to the memory cell for a second duration to store the first logic state in the memory cell, the second duration different from the first duration.

2. The method of claim 1, further comprising:

identifying the second duration for the one or more second pulses that corresponds to the first logic state, wherein applying the one or more second pulses is based at least in part on identifying the second duration.

3. The method of claim 2, wherein identifying the second duration comprises:

identifying the second duration based at least in part on a current of the one or more second pulses, a voltage of the one or more second pulses, a quantity of the one or more second pulses, or a combination thereof.

4. The method of claim 1, further comprising:

receiving a second command to store a third logic state in the memory cell comprising the chalcogenide material;

applying, as part of the erase operation, the first pulse to the plurality of memory cells for the first duration to store the second logic state different from the first logic state in the plurality of memory cells; and applying, as part of the write operation, a third pulse to the memory cell for a third duration to store the third logic state in the memory cell, the third duration different from the second duration.

5. The method of claim 4, wherein a first current for the third pulse is different than a second current for the one or more second pulses used to program the first logic state.

6. The method of claim 1, wherein the erase operation occurs before performing the write operation, and wherein the write operation comprises pulses of a single polarity.

7. The method of claim 1, wherein the erase operation is an asynchronous operation relative to the write operation.

8. The method of claim 1, wherein the erase operation comprises a block erase operation for erasing a block of memory cells, the block of memory cells comprising the plurality of memory cells.

9. The method of claim 1, wherein the first logic state comprises an intermediate logic state, the second logic state comprises a reset state, and a third logic state comprises a set state.

10. The method of claim 1, wherein the three or more logic states for storing by the memory cell comprise the second logic state associated with a first threshold voltage, a third logic state associated with a second threshold voltage, and the first logic state associated with an intermediate threshold voltage between the first threshold voltage and the second threshold voltage based at least in part on a polarity of one or more read pulses being a same as the first polarity of the one or more second pulses used to program the first logic state.

11. The method of claim 1, wherein:

applying the first pulse to the plurality of memory cells for the first duration to store the second logic state comprises:

applying a first voltage to one or more word lines coupled with the plurality of memory cells; and applying a second voltage to one or more digit lines coupled with the plurality of memory cells, wherein an absolute value of the second voltage is greater than an absolute value of the first voltage; and applying the one or more second pulses for the second duration to the memory cell to store the first logic state further comprises:

applying a third voltage to a word line coupled with the memory cell; and applying one or more fourth voltages to a digit line coupled with the memory cell, wherein an absolute value of the one or more fourth voltages is greater than an absolute value of the third voltage.

12. The method of claim 1, wherein the erase operation occurs before performing the write operation, and wherein the write operation comprises pulses of a single polarity.

13. The method of claim 1, wherein the erase operation is configured as a drift cancellation operation.

14. A memory device for operating a memory array, comprising:

one or more processors;

memory coupled with the one or more processors; and instructions stored in the memory and executable by the one or more processors to cause the memory device to:

receive a first command to store a first logic state in a memory cell comprising a chalcogenide material, wherein the memory cell is for storing three or more logic states;

apply, as part of an erase operation, an initial pulse with a first polarity to a plurality of memory cells;

apply, as part of the erase operation and based at least in part on applying the initial pulse with the first polarity, a first pulse with a second polarity to the plurality of memory cells for a first duration to store a second logic state different from the first logic state in the plurality of memory cells, the plurality of memory cells comprising the memory cell; and apply, as part of a write operation, one or more second pulses with the first polarity to the memory cell for a second duration to store the first logic state in the memory cell, the second duration different from the first duration.

15. The memory device of claim 14, wherein the instructions are further executable by the one or more processors to cause the memory device to:

identify the second duration for the one or more second pulses that corresponds to the first logic state, wherein applying the one or more second pulses is based at least in part on identifying the second duration.

16. The memory device of claim 15, wherein the instructions are further executable by the one or more processors to cause the memory device to:

identify the second duration based at least in part on a current of the one or more second pulses, a voltage of the one or more second pulses, a quantity of the one or more second pulses, or a combination thereof.

17. The memory device of claim 14, wherein the instructions are further executable by the one or more processors to cause the memory device to:

receive a second command to store a third logic state in the memory cell comprising the chalcogenide material;

apply, as part of the erase operation, the first pulse to the plurality of memory cells for the first duration to store the second logic state different from the first logic state in the plurality of memory cells; and apply, as part of the write operation, a third pulse to the memory cell for a third duration to store the third logic state in the memory cell, the third duration different from the second duration.

18. A non-transitory computer-readable medium storing code comprising instructions which, when executed by one or more processors of a device, cause the device to:

receive a first command to store a first logic state in a memory cell comprising a chalcogenide material, wherein the memory cell is for storing three or more logic states;

apply, as part of an erase operation, an initial pulse with a first polarity to a plurality of memory cells;

apply, as part of the erase operation and based at least in part on applying the initial pulse with the first polarity, a first pulse with a second polarity to the plurality of memory cells for a first duration to store a second logic state different from the first logic state in the plurality of memory cells, the plurality of memory cells comprising the memory cell; and apply, as part of a write operation, one or more second pulses with the first polarity to the memory cell for a second duration to store the first logic state in the memory cell, the second duration different from the first duration.

* * * * *